(12) United States Patent
Takada et al.

(10) Patent No.: US 10,592,029 B2
(45) Date of Patent: Mar. 17, 2020

(54) DISPLAY DEVICE AND METHOD USING STRIPE ELECTRODES

(71) Applicant: Japan Display Inc., Tokyo (JP)

(72) Inventors: Naoki Takada, Tokyo (JP); Hayato Kurasawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 3 days.

(21) Appl. No.: 15/950,878

(22) Filed: Apr. 11, 2018

(65) Prior Publication Data

US 2018/0300000 A1    Oct. 18, 2018

(30) Foreign Application Priority Data

Apr. 13, 2017   (JP) .................................. 2017-079910

(51) Int. Cl.
| | |
|---|---|
| *G06F 3/041* | (2006.01) |
| *G06F 3/044* | (2006.01) |
| *G02F 1/1333* | (2006.01) |
| *G09G 3/36* | (2006.01) |
| *H01L 27/12* | (2006.01) |
| *G02F 1/1362* | (2006.01) |

(52) U.S. Cl.
CPC ........ *G06F 3/0412* (2013.01); *G02F 1/13338* (2013.01); *G02F 1/136286* (2013.01); *G06F 3/044* (2013.01); *G06F 3/0416* (2013.01); *G09G 3/3611* (2013.01); *G09G 3/3655* (2013.01); *G09G 3/3677* (2013.01); *H01L 27/124* (2013.01); *G02F 2201/121* (2013.01); *G02F 2201/123* (2013.01); *G06F 2203/04103* (2013.01)

(58) Field of Classification Search
CPC ...... G06F 3/044; G06F 3/0414; G06F 3/0412; G06F 3/0416
See application file for complete search history.

(56) References Cited

U.S. PATENT DOCUMENTS

| | | | | |
|---|---|---|---|---|
| 2014/0035890 A1* | 2/2014 | Jinta | ........................ | G09G 3/20 345/204 |
| 2015/0277657 A1 | 10/2015 | Azumi et al. | | |
| 2016/0188040 A1* | 6/2016 | Shin | ........................ | G06F 3/047 345/174 |
| 2017/0017320 A1* | 1/2017 | Tsai | ........................ | G06F 3/044 |
| 2017/0031520 A1* | 2/2017 | Kang | .................... | G06F 3/0418 |
| 2017/0115798 A1* | 4/2017 | Ho | ........................ | G06F 3/0412 |
| 2017/0364203 A1 | 12/2017 | Azumi et al. | | |
| 2018/0059838 A1* | 3/2018 | Chung | ................ | G02F 1/13338 |

FOREIGN PATENT DOCUMENTS

JP       2015-201175 A    11/2015

* cited by examiner

*Primary Examiner* — Yuzhen Shen
(74) *Attorney, Agent, or Firm* — K&L Gates LLP

(57) ABSTRACT

According to one embodiment, a display device includes touch detection electrodes, and a driver. The touch detection electrodes include stripe common electrodes serving as electrodes for display. The driver includes a first, second, and third drivers for driving each of the stripe electrodes. Auxiliary lines connect each of the stripe electrodes to the third driver. The first and second drivers are provided along shorter sides of the stripe electrodes. The third driver is provided along a longer side of the stripe electrodes.

14 Claims, 18 Drawing Sheets

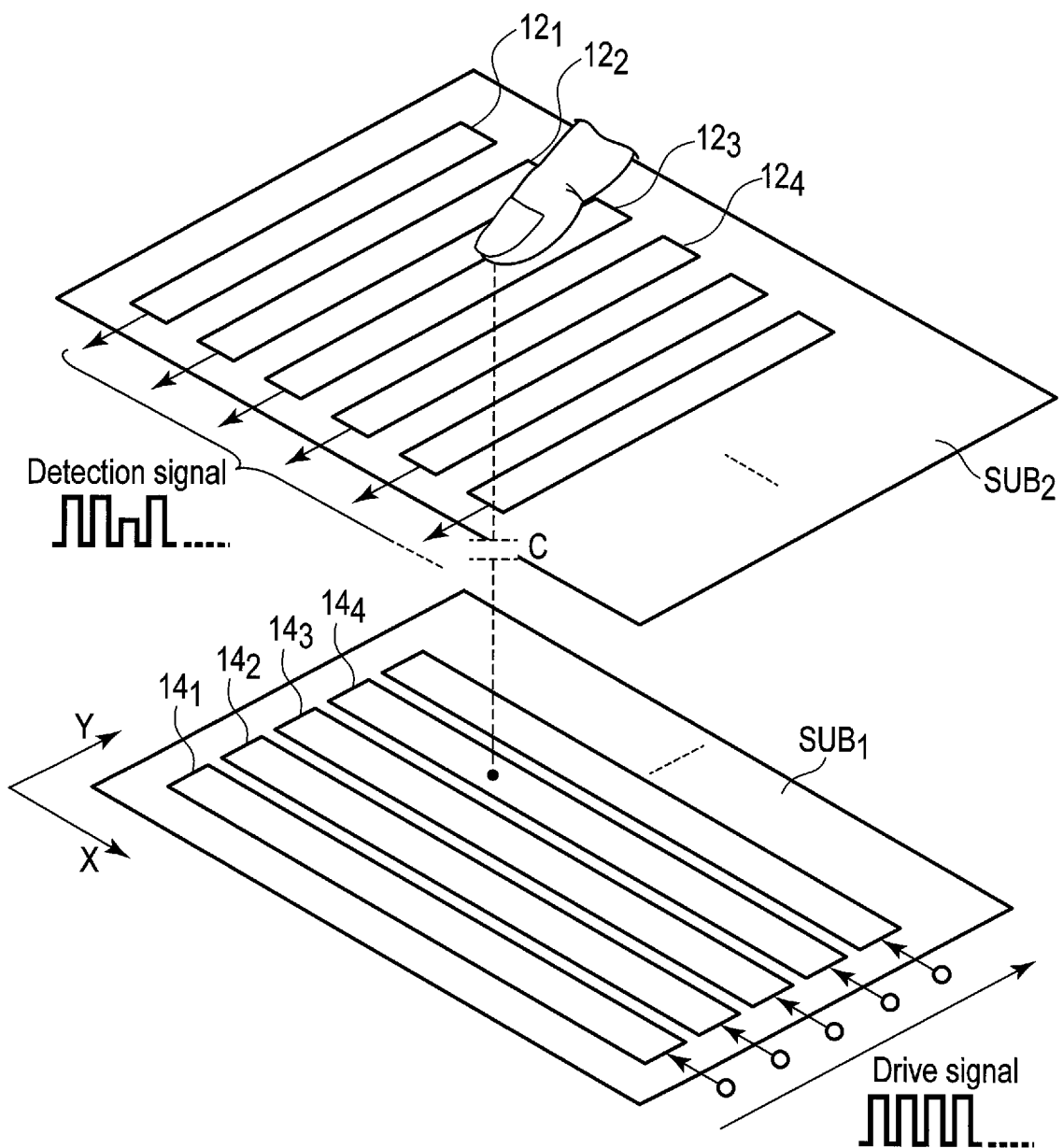
F I G. 2

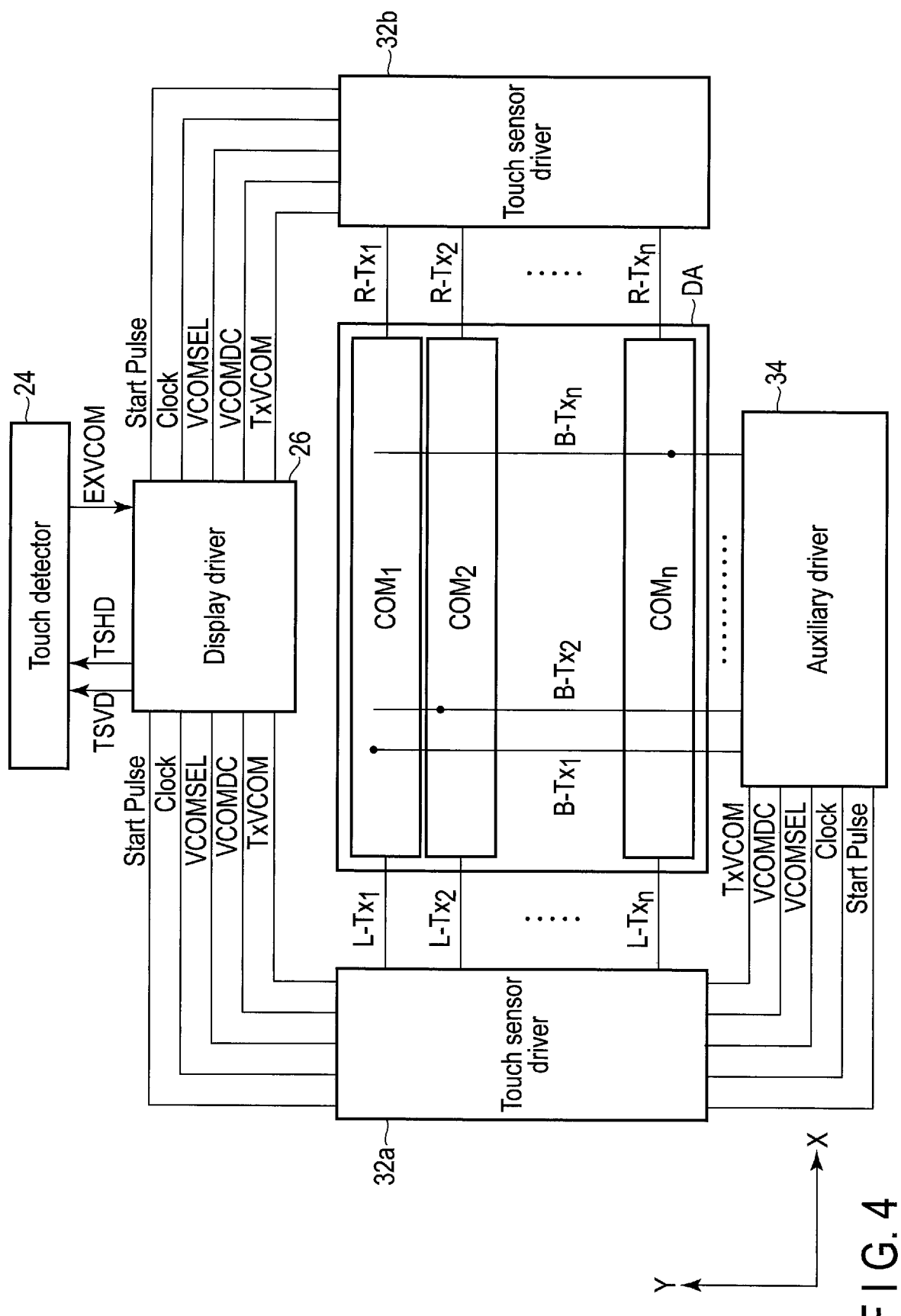
F I G. 4

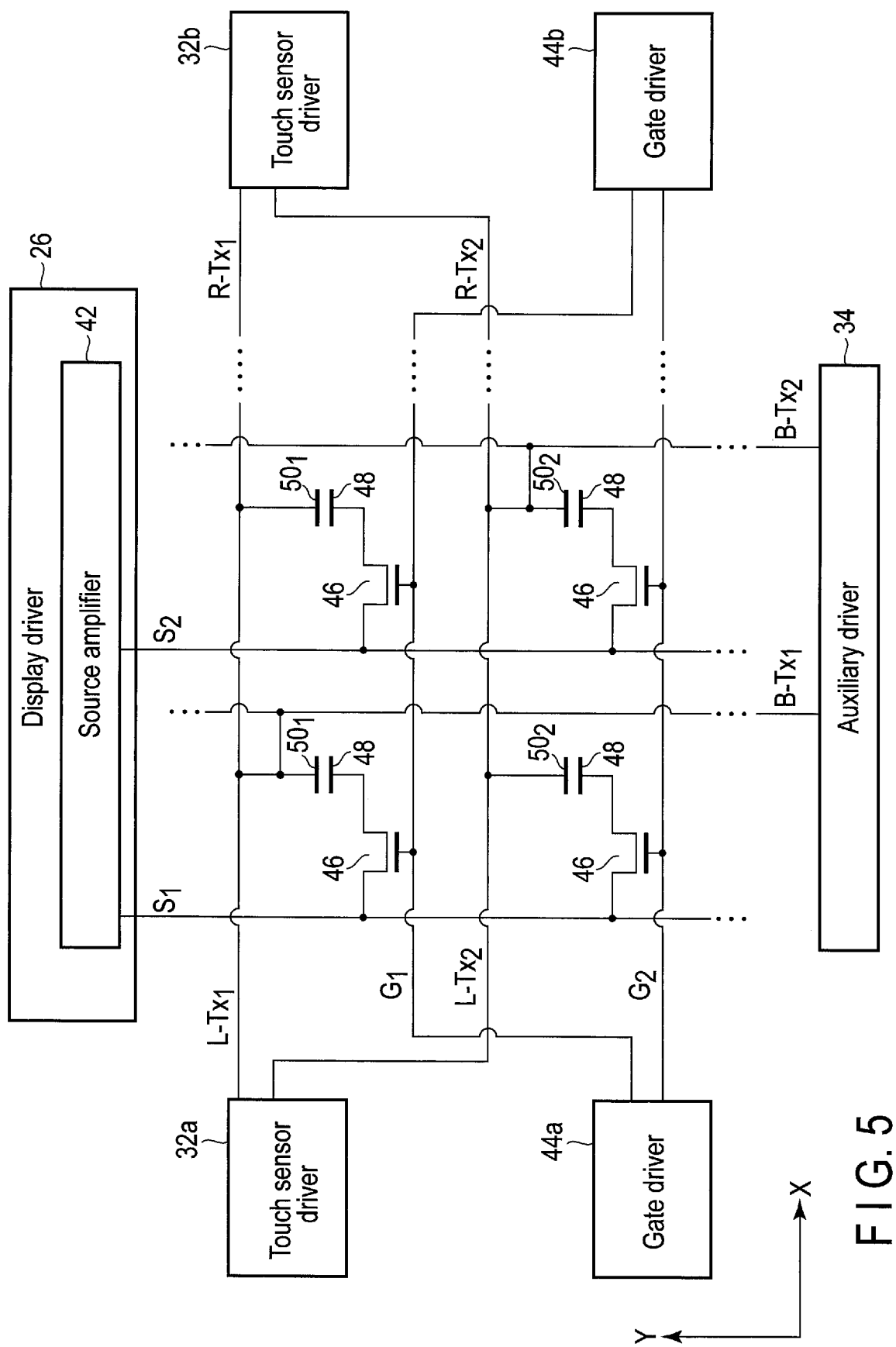
F I G. 5

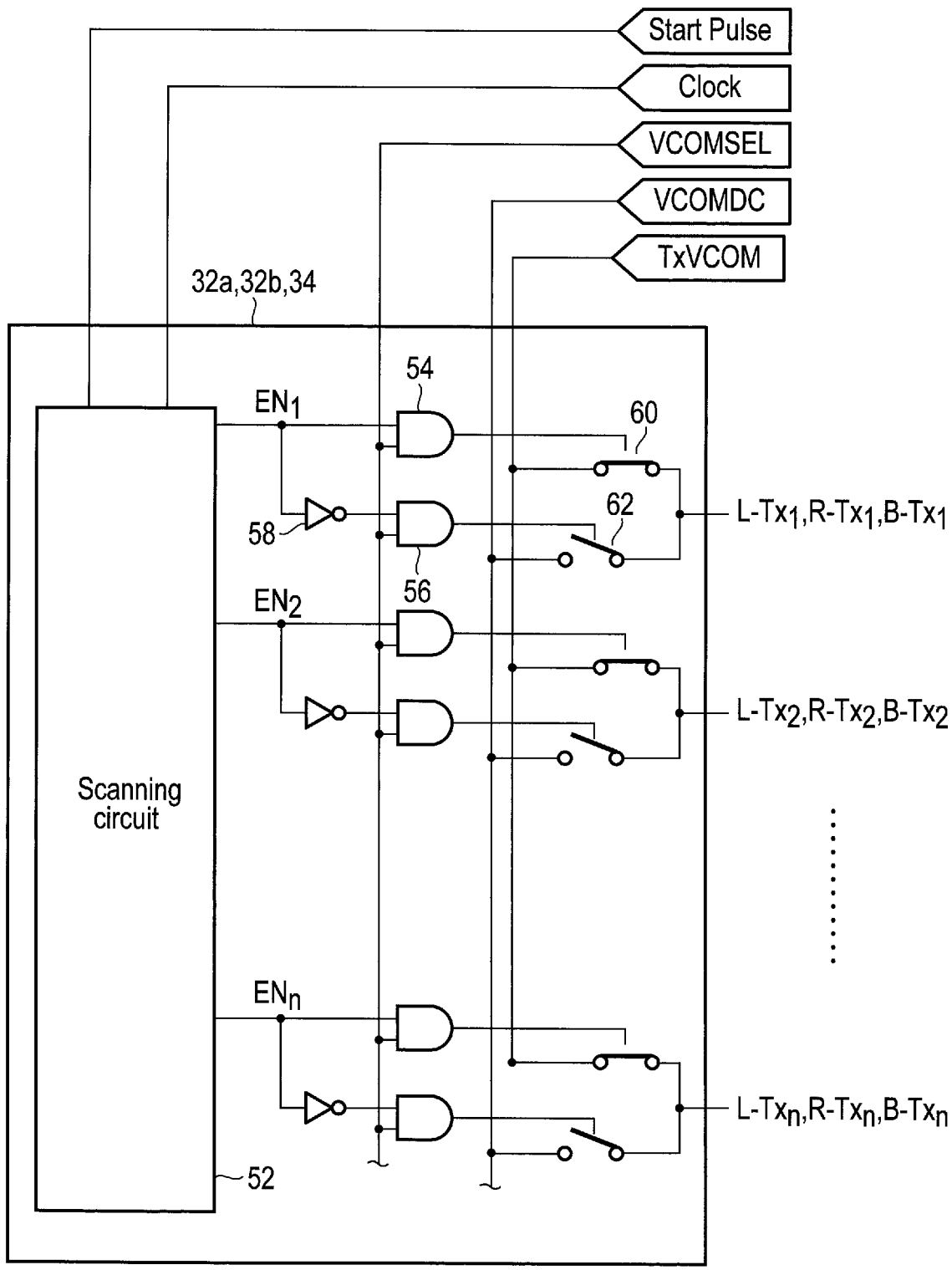
F I G. 6

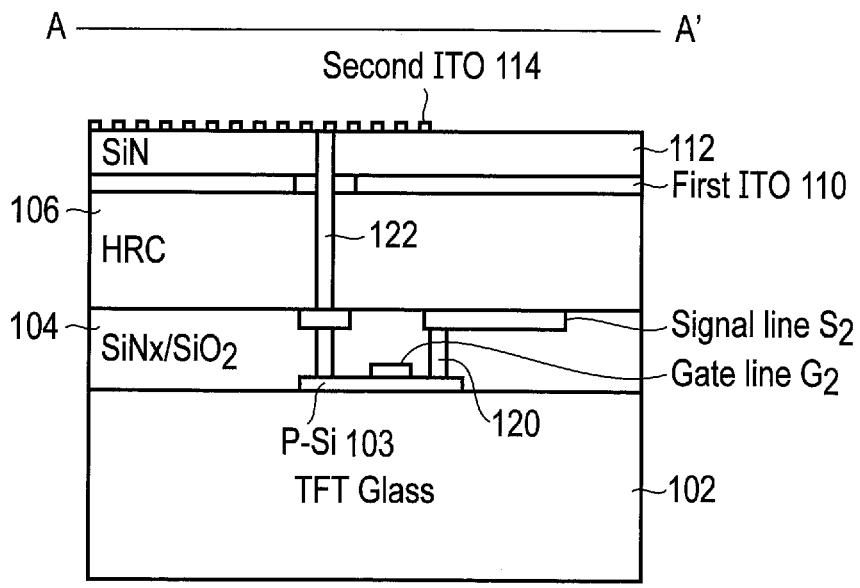
F I G. 9A
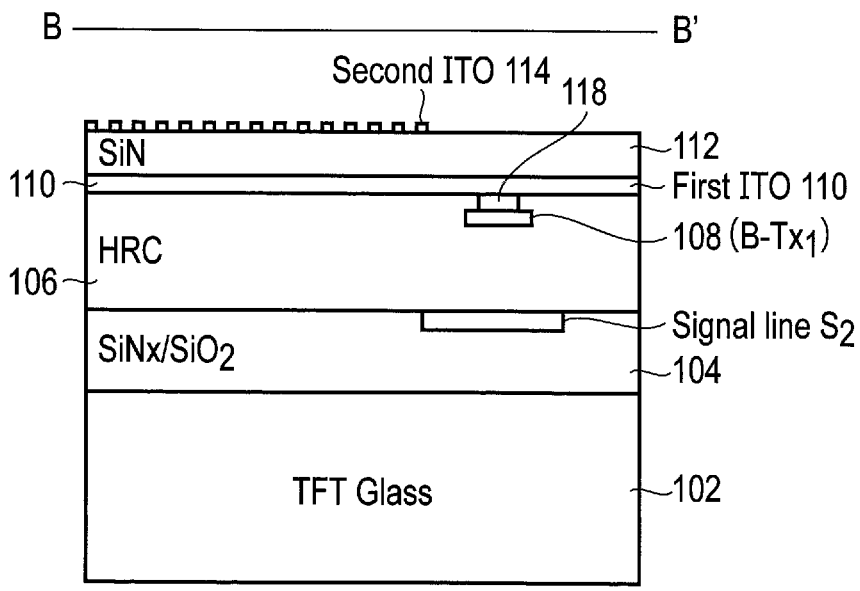
F I G. 9B

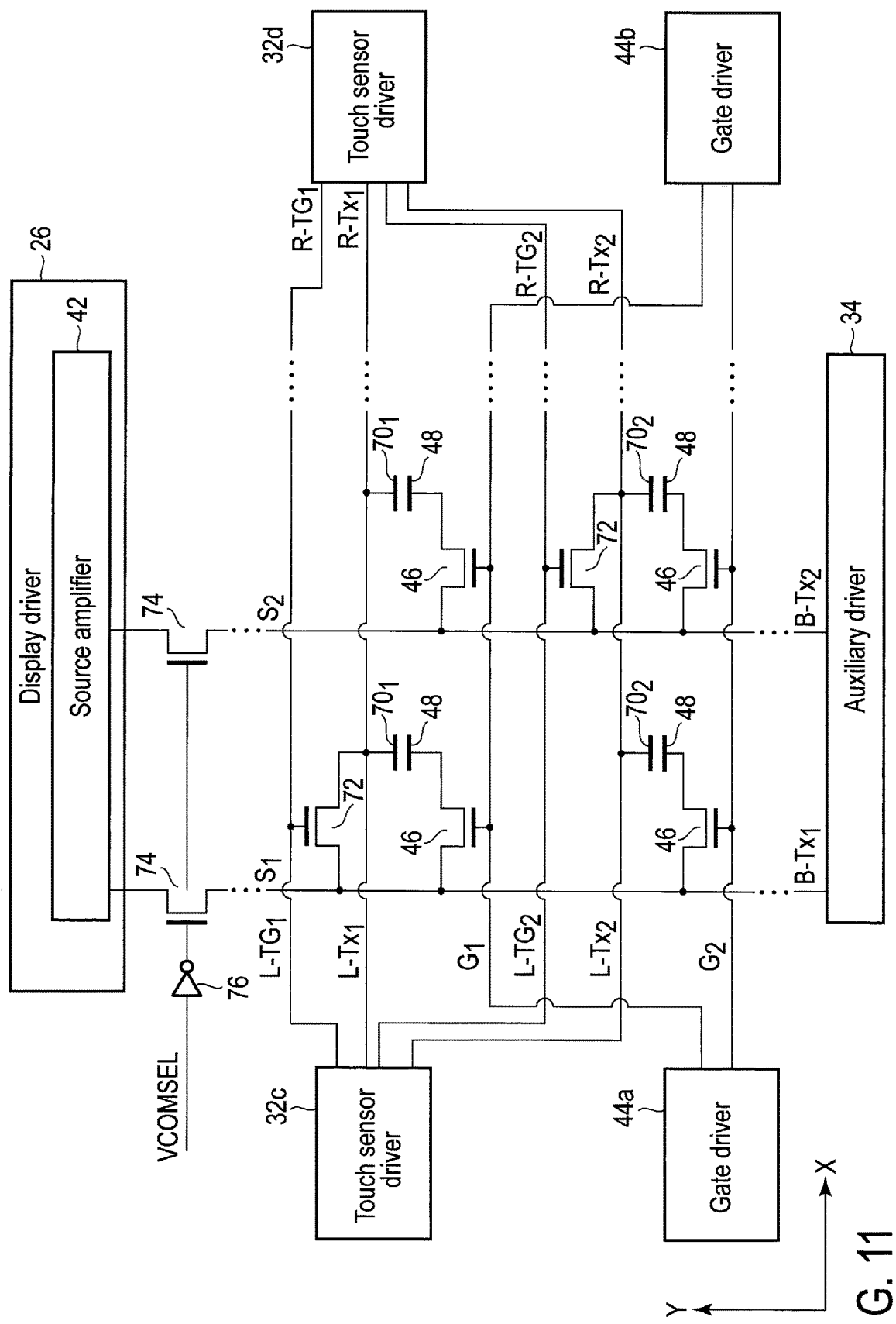
F I G. 11

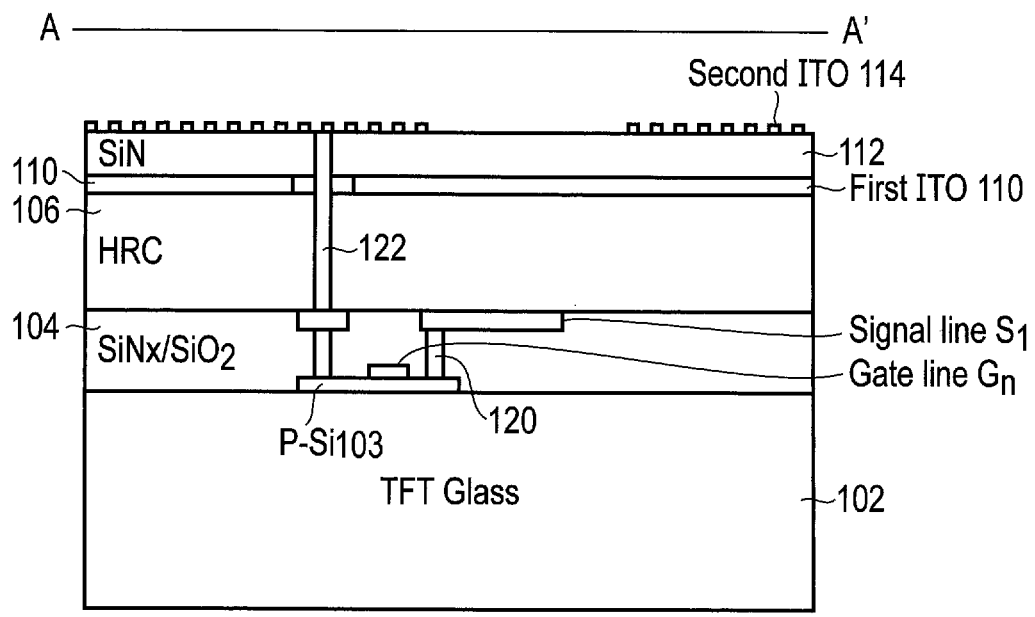
F I G. 15A
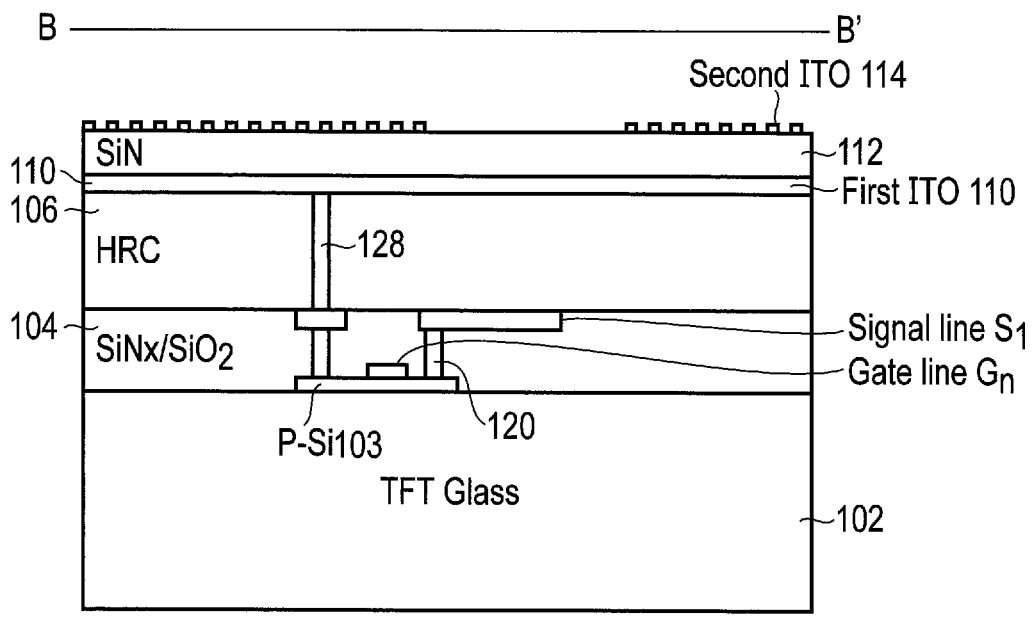
F I G. 15B

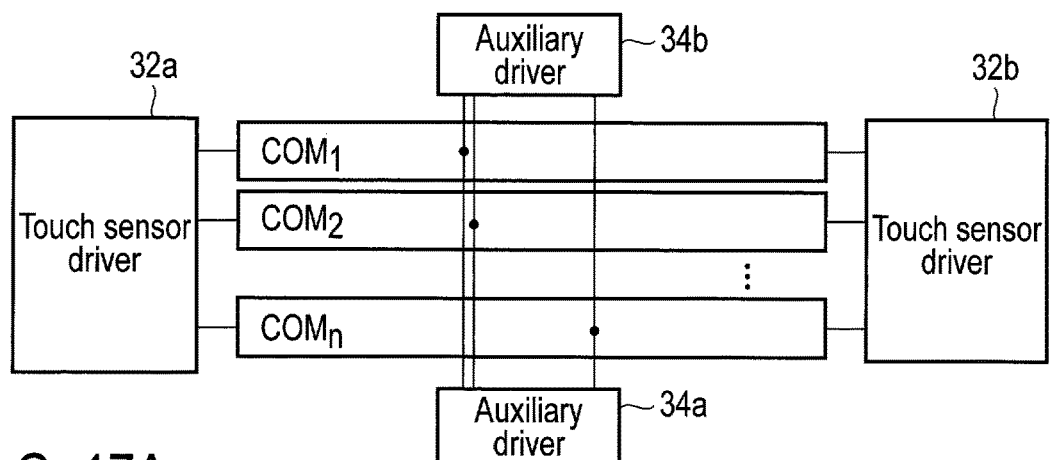
F I G. 17A
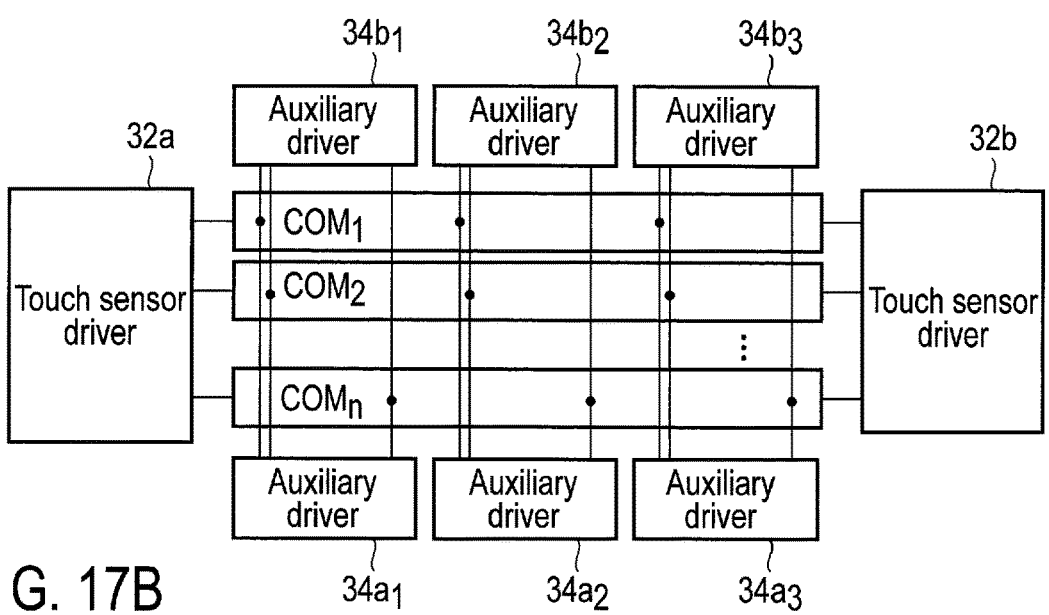
F I G. 17B
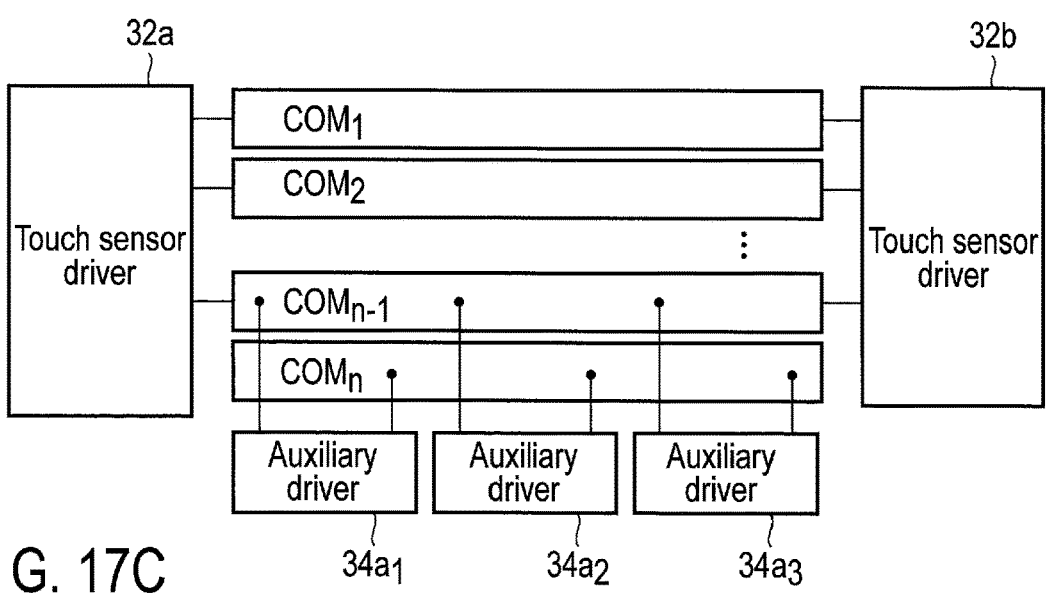
F I G. 17C

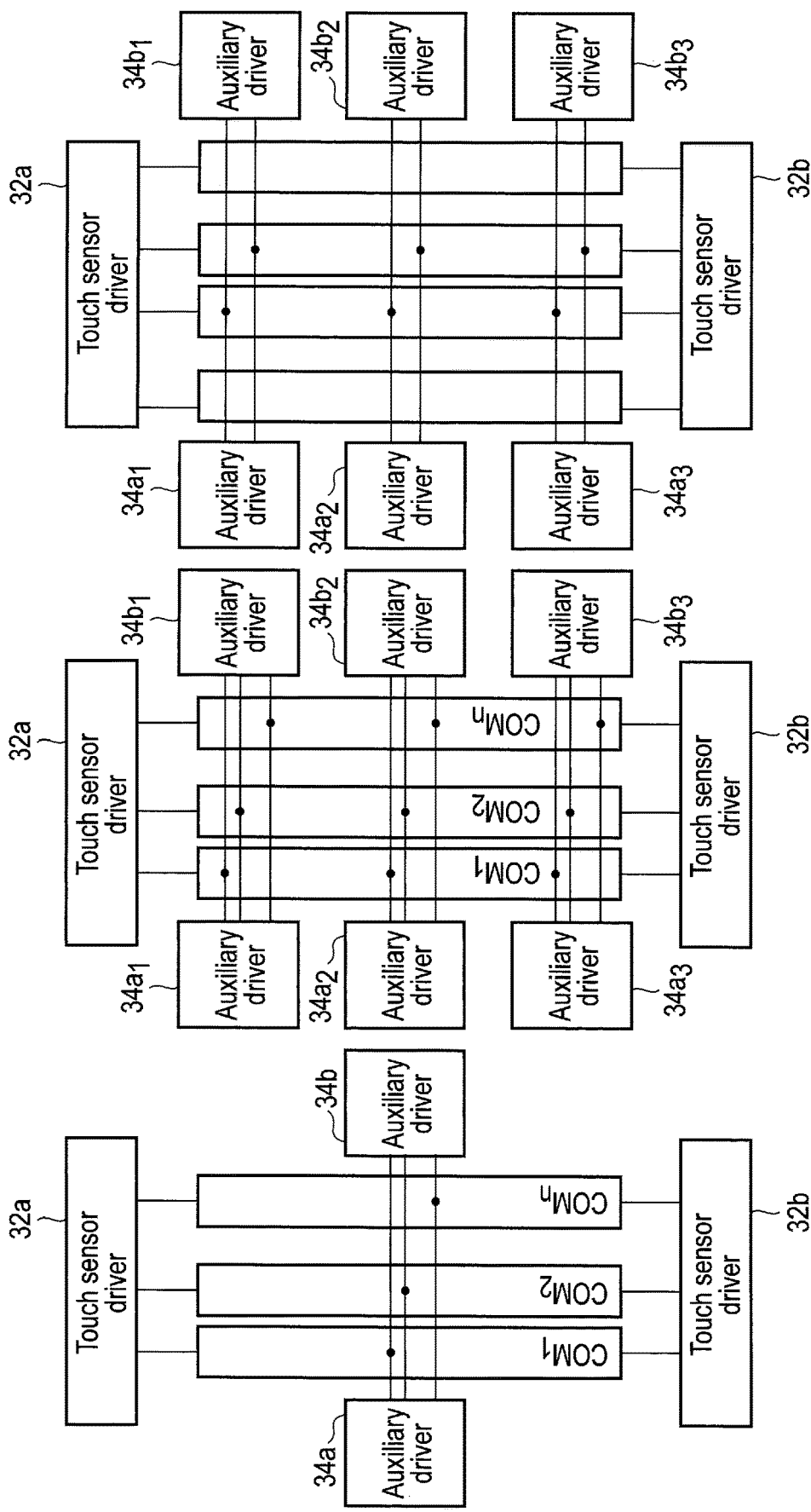

DISPLAY DEVICE AND METHOD USING STRIPE ELECTRODES

CROSS-REFERENCE TO RELATED APPLICATIONS

This application is based upon and claims the benefit of priority from Japanese Patent Application No. 2017-079910, filed Apr. 13, 2017, the entire contents of which are incorporated herein by reference.

FIELD

Embodiments described herein relate generally to a display device with a touch detection function and a driving method of the display device.

BACKGROUND

Mobile terminals such as smartphones, tablet computers and notebook computers have been prevalent. A mobile terminal includes a flat display device using liquid crystal or organic electro-luminescence (EL) elements. The display device is connected to a host device which outputs image data, commands, and the like. The display device includes a display panel and a driver which processes commands and drives the display panel.

In the display device, pixels two-dimensionally arranged on the display panel include a common electrode and a pixel electrode. The liquid crystal or organic EL elements are arranged between the common electrode and the pixel electrode. When the driver writes a pixel signal to the pixels on the display panel, the liquid crystal or organic EL elements arranged between the common electrode and the pixel electrode are controlled and an image is thereby displayed.

Display devices capable of detecting an inputting object such as a finger and a touch pen (also called a stylus) approaching or contacting the screen have been widely employed. The operation of allowing the inputting object to approach or contact the screen is called a touch operation or a touch, and the detection of a position of the inputting object is called touch detection. Examples of the touch detection include various types such as an optical type, a resistive type, a capacitive type, and an electromagnetic induction type. The capacitive type is the detection type utilizing a feature that the electrostatic capacitance between a pair of electrodes (called a drive electrode and a detection electrode) is varied by approach or contact of the inputting object, and has benefits that the structure is comparatively simple and that the power consumption is small.

The display device equipped with the touch detection function includes an on-cell type (also called an external type) in which the display device and the touch panel implementing the touch function are produced separately and the touch panel is bonded to the screen of the display device, and an in-cell type (also called a built-in type) in which the display device and the touch panel are integrated. In the in-cell type display device, for example, the detection electrode is formed between a color filter and a polarizer, and a common electrode formed on a thin film transistor (TFT) substrate is also used as a drive electrode. Since the in-cell type display device includes no external touch panel, the display device is entirely slim and lightweight, and visibility of the display is also improved. In the in-cell type display device, however, the display period and the touch detection period need to be set separately and achievement of both the display drive and the touch detection is a problem to be solved.

Recently, touch panel-equipped display devices have increased in size. For example, elongated display devices have been developed similarly to center information display (CID) units provided on dashboards of vehicles to function as display devices for displaying road guidance information, and the like in a car navigation system. The CID unit displays gauges such as a speedometer, a tachometer, a fuel gauge, a water temperature gauge, and a range finder, and the information similar to the gauges, in addition to the road guidance information.

An in-cell type display device includes a number of wiring layers, much parasitic capacitance and much parasitic resistance, a large time constant of CR, and the drive electrode can hardly be driven with a desired waveform. For accurate touch detection, the drive electrode needs to be driven with a desired waveform. For this reason, the touch detection period is required to be longer in the in-cell type display device. To maintain the display frame rate, however, the touch detection period cannot be freely made longer.

Thus, the conventional display device including the in-cell type touch detection function is influenced by the parasitic capacitance and parasitic resistance, and the drive electrode can hardly be driven appropriately.

SUMMARY

The present application relates generally to a display device with a touch detection function and a driving method of the display device.

According to one embodiment, a display device includes touch detection electrodes, and a driver. The touch detection electrodes include stripe common electrodes serving as electrodes for display. The driver includes a first, second, and third drivers for driving each of the stripe electrodes. Auxiliary lines connect each of the stripe electrodes to the third driver. The first and second drivers are provided along shorter sides of the stripe electrodes. The third driver is provided along a longer side of the stripe electrodes.

BRIEF DESCRIPTION OF THE DRAWINGS

FIG. 2 is an illustration showing an example of a basic configuration of a mutual-capacitive display panel.

FIG. 4 is a diagram showing an example of a planar layout of a display driver 26 and a touch sensor driver 32.

FIG. 5 is a circuit diagram showing an example of a pixel array included in a display area.

FIG. 6 is a circuit diagram showing an example of touch sensor drivers 32a and 32b and an auxiliary driver 34.

FIG. 9A is an exemplary cross-sectional view seen along line A-A' of FIG. 8.

FIG. 9B is an exemplary cross-sectional view seen along line B-B' of FIG. 8.

FIG. 11 is a circuit diagram showing an example of a pixel array included in the display area DA shown in FIG. 10.

FIG. 15A is an exemplary cross-sectional view seen along line A-A' of FIG. 14.

FIG. 15B is an exemplary a cross-sectional view seen along line B-B' of FIG. 14.

FIG. 17A is a circuit diagram showing an example of a block circuit according to a second modified example.

FIG. 17B is a circuit diagram showing another example of a block circuit according to a second modified example.

FIG. 17C is a circuit diagram showing still another example of a block circuit according to a second modified example.

FIG. 18A is a circuit diagram showing an example of a block circuit according to a third modified example.

FIG. 18B is a circuit diagram showing another example of a block circuit according to a third modified example.

FIG. 18C is a circuit diagram showing still another example of a block circuit according to a third modified example.

DETAILED DESCRIPTION

Figure 1:
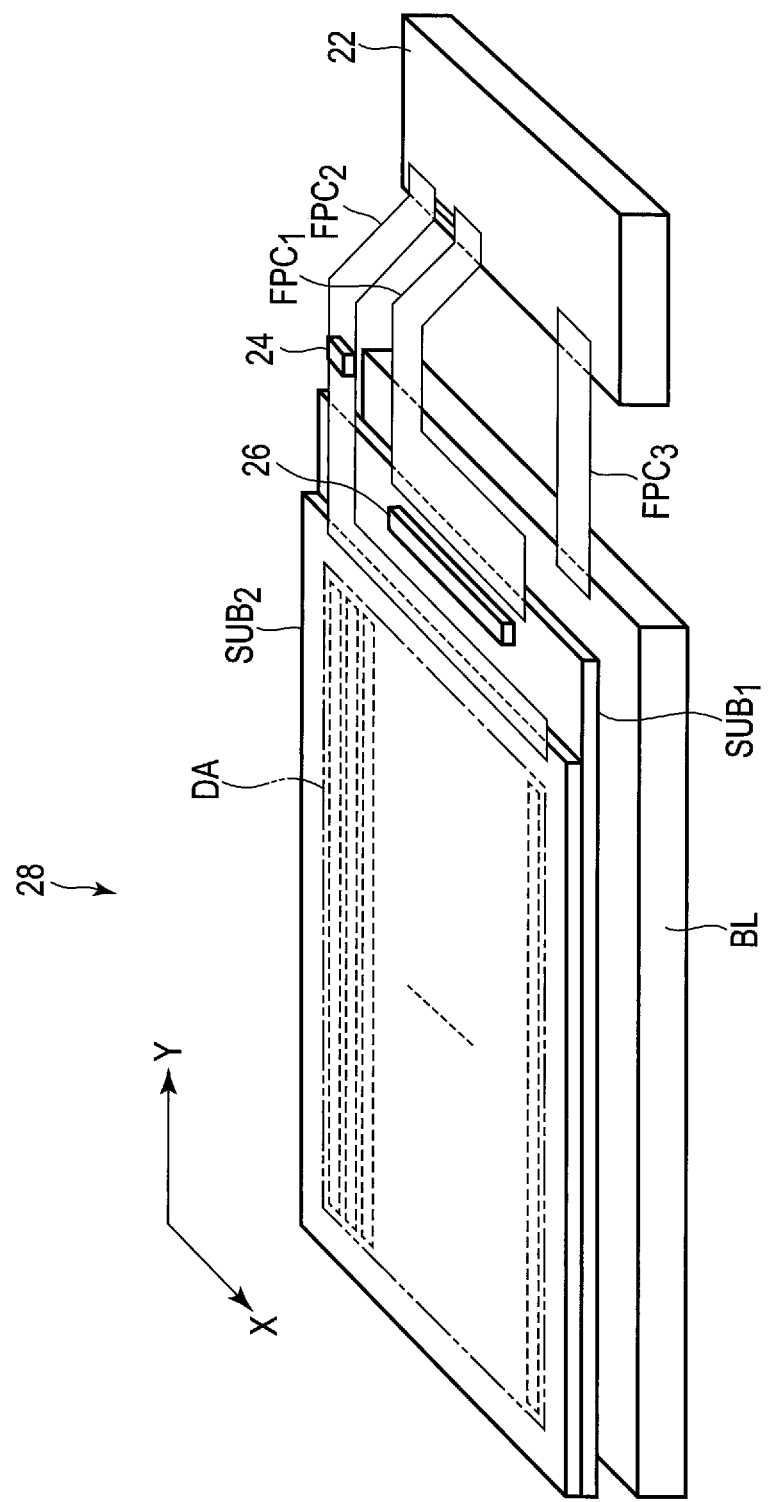
FIG. 1 is a perspective view showing an entire schematic configuration of an example of a display device including a touch detection function according to an embodiment.

Embodiments will be described hereinafter with reference to the accompanying drawings. In general, according to one embodiment, a display device includes a display unit configured to display an image, an electrode unit provided in a display area of the display unit and configured to detect a touch by an external object, and a driver provided outside the display area and configured to drive the electrode unit. The electrode unit includes a common electrode serving as an electrode for display. The common electrode includes stripe electrodes. The driver includes a first driver, a second driver, a third driver, and auxiliary lines connecting each of the stripe electrodes to the third driver. The first driver is provided along first shorter sides of the stripe electrodes. The second driver is provided along second shorter sides of the stripe electrodes. The third driver is provided along a first longer side of one of the stripe electrodes. Each of the stripe electrodes are driven by the first driver, the second driver, and the third driver.

The disclosure is merely an example and is not limited by contents described in the embodiments described below. Modification which is easily conceivable by a person of ordinary skill in the art comes within the scope of the disclosure as a matter of course. In order to make the description clearer, the sizes, shapes and the like of the respective parts may not be illustrated as they are, but may be changed and illustrated schematically in the drawings, and hatching attached to distinguish structures may be omitted. Constituent elements corresponding to each other in a plurality of drawings may be denoted by the same reference numerals and their detailed descriptions may be omitted unless necessary.

A display device equipped with a capacitive touch detection function will be explained as the embodiments. However, the touch detection type is not limited to the capacitive type, but the other types such as an electromagnetic induction type can also be adopted. The capacitive type includes a mutual-capacitive type (mutual capacitive sensing) for detecting an electrostatic capacitance between two detection electrodes opposed to be spaced apart from each other and a self-capacitive type (self capacitive sensing) for detecting an electrostatic capacitance between one detection electrode and, for example, a referential potential such as a ground potential. The mutual capacitive sensing will be explained as an example, but the embodiments can also be applied to a display device which executes self-capacitive touch detection. In the self capacitive sensing, an electrode to which the reference potential is supplied has a conductive pattern of being provided around the detection electrode in a remote distance to form an electrostatic capacitance which can be detected between the electrode and the detection electrode, a path for supplying a fixed potential may be connected to the electrode, and the shape and the like of the electrode are not particularly limited. The display device including the touch detection function is an aspect of the input device, and detects an input signal and calculates a touch position when an inputting object such as a finger and a touch pen (also called a stylus) touches or approaches the touch surface. The touch position is coordinates of a point at which the input signal is detected, on the touch surface.

A liquid crystal display device, an organic EL display device, a plasma display device, and the like can be used as the display device and, the embodiments using the liquid crystal display device will be explained hereinafter as an example, but the embodiments can also be applied to the organic EL display device, the plasma display device, and the like. The display mode of the liquid crystal display device is largely classified into two modes in accordance with the direction of application of the electric field to vary the alignment of liquid crystal molecules of a liquid crystal layer which is a display function layer. The first mode is what is called a longitudinal electric field mode in which the electric field is applied in a thickness direction (or an out-of-plane direction). The longitudinal electric field mode includes, for example, twisted nematic (TN) mode, vertical alignment (VA) mode, and the like. The second mode is what is called a lateral electric field mode in which the electric field is applied in a plane direction (or an in-plane direction). The lateral electric field mode includes, for example, In-Plane Switching (IPS) mode, fringe field switching (FFS) mode which is a type of the IPS mode, and the like. The technology explained below can be applied to any one of the longitudinal electric field mode and the lateral electric field, and the display device of the lateral electric field will be explained as the embodiments, but the embodiments can also be applied to the display device of the longitudinal electric field.

First Embodiment

[Schematic Configuration]

FIG. 1 is a perspective view showing an overall schematic configuration of an example of a display device equipped with a touch detection function according to the embodiment. The display device includes a display panel 28 with a touch detection mechanism, a touch detector 24, and a display driver 26. The display panel 28 includes a transparent first substrate $SUB_1$ formed of glass, resin, and the like, a transparent second substrate $SUB_2$ formed of glass, resin, and the like and provided to be opposed to the first substrate $SUB_1$, and a liquid crystal layer (not shown) provided between the first substrate $SUB_1$ and the second substrate $SUB_2$. Since pixels (shown in FIG. 5) are provided in two-dimensional array (also called a matrix) in the X direction and the Y direction on the first substrate $SUB_1$, the first substrate $SUB_1$ is also called a pixel substrate or an array substrate. The second substrate $SUB_2$ is also called a counter-substrate. The display panel 28 is observed from the second substrate $SUB_2$ side. For this reason, the second substrate $SUB_2$ may be called an upper substrate while the first substrate $SUB_1$ may be called a lower substrate.

The display panel 28 is shaped in a rectangular flat plate, and a direction of its shorter side is referred to as an X direction and a direction of its longer side is referred to as a Y direction. The first substrate $SUB_1$ and the second substrate $SUB_2$ are substantially the same in size of the shorter side but different in size of the lower side. The longer side of the first substrate $SUB_1$ is larger than the longer side of the second substrate $SUB_2$. Since a first edge of the first substrate $SUB_1$ and a first edge of the second substrate $SUB_2$ are aligned in the Y direction, a second edge of the first substrate $SUB_1$ protrudes further than a second edge of the second substrate $SUB_2$. The display driver 26 which drives the display panel 28 for image display is mounted on a portion of the first substrate $SUB_1$ protruding further than the second substrate $SUB_2$ in the Y direction. The display driver 26 is also called a driver IC or a display controller IC. An area where the pixels are provided in two-dimensional array is called a display area DA or an active area, and an area other than the display area DA is called a frame area.

The display device can be connected to a host device 22. The display panel 28 and the host device 22 are connected via two flexible printed circuits $FPC_1$ and $FPC_2$. The host device 22 is connected to the first substrate $SUB_1$ via the flexible printed circuit $FPC_1$. The host device 22 is connected to the second substrate $SUB_2$ via the flexible printed circuit $FPC_2$. The touch detector 24 which controls the touch detection is a Chip on Film (COF) chip provided on the flexible printed circuit $FPC_2$. The touch detector 24 is also called a touch detector IC or touch controller IC. The touch detector 24 may be a Chip on Glass (COG) chip which is not provided on the flexible printed circuit $FPC_2$, but on the first substrate $SUB_1$.

The display driver 26 and the touch detector 24 are electrically connected to each other with respect to the timing pulse and the like and cooperate with respect to the operation timing. The display driver 26 and the touch detector 24 may not be constituted as different ICs, but as a single IC. In this case, the single IC may be provided on the first substrate SUB or the flexible printed circuit $FPC_1$. The display driver 26 may also be provided not on the first substrate $SUB_1$, but on the flexible printed circuit $FPC_1$.

A backlight unit BL serving as an illumination device which illuminates the display panel 28 is provided on the back side of the first substrate $SUB_1$ (i.e., the back surface side of the display panel 28). The host device 22 is connected to the backlight unit BL via a flexible printed circuit $FPC_3$. Various types of backlight units can be employed as the backlight unit BL, and some backlight units use a light-emitting diode (LED), a cold-cathode tube (CCFL) and the like, as the light source. An illumination device using a light guide plate provided on the back surface of the display panel 28 and an LED or a cold-cathode tube provided on its side surface can be employed as the backlight unit BL. An illumination device using a spot light source in which light emitting elements are arrayed in plane on the back surface of the display panel 28 can also be employed as the backlight unit BL. Not only the backlight, but a front light provided on the display surface of the display panel 28 can be used as the illumination device. If the display device is a reflective display device or if the display panel 28 employs organic EL, the illumination device may not be provided. The display device includes a secondary battery, a power circuit, and the like, though not illustrated in the drawing.

The example shown in FIG. 1 is a longitudinally elongated screen in which the length of the Y direction is larger than the length of the X direction and the X direction is set as the lateral direction, but may be applied to a laterally elongated screen in which the length of the X direction is larger than the length of the Y direction.

[Principle of Touch Detection]

FIG. 2 shows an example of a basic configuration of the mutual-capacitive display panel 28. Detection electrodes $12_1$, $12_2$, . . . (generically 12) are formed on the second substrate $SUB_2$. The detection electrodes $12_1$, $12_2$, . . . are stripe-shaped electrodes elongated in the Y direction and are arranged in the X direction. Common electrodes $14_1$, $14_2$, . . . (generically 14) are formed on the first substrate $SUB_1$. The common electrodes $14_1$, $14_2$, . . . are stripe-shaped electrodes elongated in the X direction and are arranged in the Y direction. In other words, the common electrodes 14 are orthogonal to the detection electrodes 12 on the display panel 28. The signal lines (also called source lines) for supplying the video signals to the pixels extend in the Y direction and are orthogonal to the common electrodes 14. This arrangement is called a lateral COM type. In other words, in the lateral COM type, the common electrodes 14 are aligned in the direction of extension of the signal lines. The detection electrodes 12 may be shaped in stripes extending in the X direction and aligned in the Y direction, and the common electrodes 14 may be shaped in stripes extending in the Y direction and aligned in the X direction, oppositely to the alignment of the detection electrodes 12 and the common electrodes 14 as shown in FIG. 2. In this case, the signal lines are parallel to the common electrodes 14. This arrangement is called a longitudinal COM type. In other words, in the longitudinal COM type, the detection electrodes 12 are aligned in the direction of extension of the signal lines. The lateral COM type is exemplified in the following explanations but the embodiments can also be applied to the longitudinal COM type.

A liquid crystal layer is intervened between the first substrate $SUB_1$ and the second substrate $SUB_2$, and the detection electrodes 12 and the common electrodes 14 are spaced apart from each other. For this reason, an electrostatic capacitance C exists between the detection electrodes 12 and the common electrodes 14. One detection electrode 12 does not need to be provided for each column of the pixel array (extending in the Y direction) but one detection electrode 12 may be provided for arbitrary columns. One common electrode 14 does not need to be provided for each row of the pixel array (extending in the X direction) but one common electrode 14 may be provided for arbitrary rows.

The common electrodes $14_1$, $14_2$, . . . are sequentially driven by a drive signal which is a high-frequency pulse signal. For example, when a human finger is in contact with or approaching the vicinity to the intersection between the detection electrode $12_3$ and the common electrode $14_4$, and when the drive signal is supplied to the common electrode $14_4$, a pulse-shaped detection signal of a lower level than signals obtained from the detection electrodes $12_1$, $12_2$, $12_4$, $12_5$, . . . is output from the detection electrode $12_3$. The detection electrode 12 monitors a fringing field from the common electrode 14 and, when a conductive object such as a finger approaches the detection electrode 12, the fringing field is blocked, the value of the electrostatic capacitance C is varied, and the level of the detection signal of the detection electrode 12 is lowered. The mutual-capacitive touch detection handles a difference in detection level as the detection signal of the touch position.

The value of the electrostatic capacitance C is varied when the finger is close to or remote from the detection electrode 12. For this reason, the detection signal level is also varied when the finger is close to or remote from the detection electrode 12. The proximity of the finger to the screen of the display panel 28 can be therefore determined based on the detection signal level. The touch position of the finger on the screen can be detected in accordance with the drive timing of the common electrode 14 based on the drive signal and the position of the detection electrode 12 from which the low-level detection signal is output.

The common electrode 14 is employed as an electrode for touch detection and also employed as a drive electrode to drive the liquid crystal for display. For this reason, a plurality of display periods are set in one frame period, a touch detection period (also called a non-display period) is set between the display period and the subsequent display period, and the display operation and the touch detection operation are executed in time division.

In the display periods, the drive signal which is a constant DC voltage for display is supplied to all of the common electrodes 14, a video signal for one or more lines is written to the pixels from the host device 22, and an image corresponding to the video signal is displayed.

The drive signal is sequentially supplied to the common electrodes $14_1$, $14_2$, $14_3$, . . . and the voltages of the common electrodes 14 are varied, in the touch detection period. Only one common electrode 14 is not driven in one touch detection period, but a plurality of common electrodes 14 may be driven in one touch detection period and the number of the common electrodes 14 driven in one touch detection period can arbitrarily be set. In the mutual-capacitive touch sensor, all of the common electrodes 14 are not driven simultaneously but are sequentially driven by one or more common electrodes 14. The former is called simultaneous drive while the latter is called sequential drive. The sequential drive is not limited to sequentially driving a plurality of common electrodes 14 but also includes driving the common electrodes 14 at random.

[Circuit Configuration]

Figure 3:
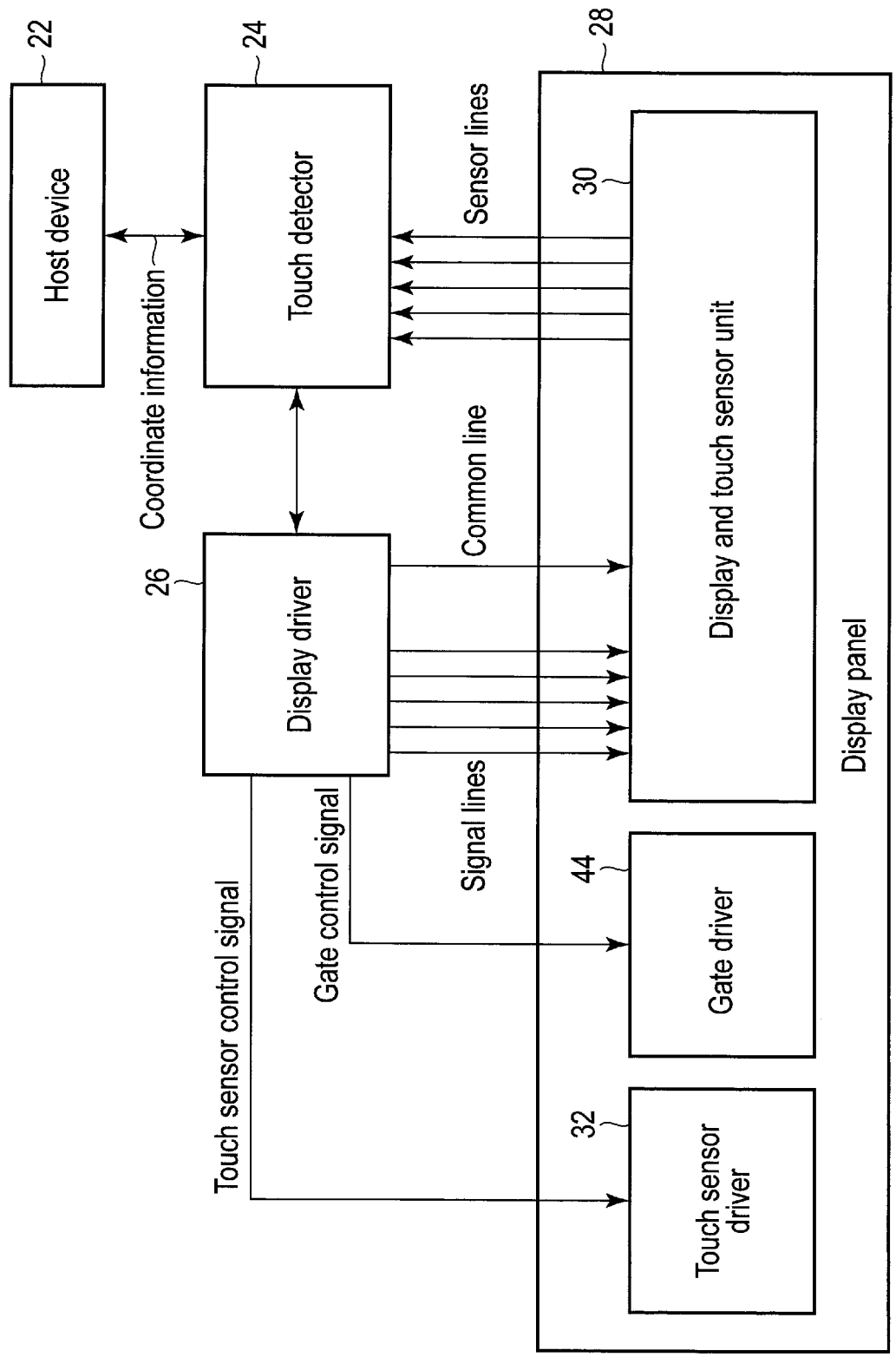
FIG. 3 is a circuit diagram showing an example of a display device according to the embodiment.

FIG. 3 is a circuit diagram showing an example of the display device according to the embodiments. The display panel 28 includes a display and touch sensor unit 30, a touch sensor driver 32, and a gate driver 44. The display and touch sensor unit 30 includes the detection electrodes 12 and the common electrodes 14 shown in FIG. 2. The detection signals output from the detection electrodes 12 are supplied to the touch detector 24 via a plurality of sensor lines. The common electrodes 14 are connected to the display driver 26 via a plurality of signal lines (also called source lines) and a common line. The display driver 26 supplies a gate control signal to the gate driver 44 and supplies a touch sensor control signal to the touch sensor driver 32. The gate driver 44 drives the display and touch sensor unit 30 during a display period. The touch sensor driver 32 drives the display and touch sensor unit 30 during a touch detection period. The touch detector 24 executes communications of coordinate signals with the host device 22.

FIG. 4 is a diagram showing an example of a planar layout of the display driver 26 and the touch sensor driver 32. The embodiment includes two touch sensor drivers 32a and 32b and one auxiliary driver 34. The auxiliary driver 34 is equivalent to the touch sensor drivers 32a and 32b. The touch sensor drivers 32a and 32b are provided in right and left frame areas (X direction) of the display area DA, respectively. The Y direction is a vertical direction and the side on which the display driver 26 is provided is the upper side. The auxiliary driver 34 is provided in a lower frame area of the display area DA. The display driver 26 is provided in an upper frame area of the display area DA. The display driver 26 supplies a vertical synchronization signal TSVD and a horizontal synchronization signal TSHD to the touch detector 24, and the touch detector 24 supplies a drive synchronization signal EXVCOM to the display driver 26. The display driver 26 supplies a start pulse, a clock, a selected voltage signal VCOMSEL, a DC voltage signal VCOMDC, and a drive pulse TxVCOM to the touch sensor drivers 32a and 32b and the auxiliary driver 34.

The display area DA includes "n" common electrodes $COM_1$ to $COM_n$ (often generically called COM) for touch detection. The common electrodes COM correspond to the common electrodes 14 shown in FIG. 2. The common electrodes COM are stripe-shaped electrodes elongated in the X direction and are provided for every one or several pixel rows. However, the common electrodes COM may be stripe-shaped electrodes elongated in the Y direction and may be provided for every one or several pixel columns. The touch sensor driver 32a sequentially supplies touch drive signals $L-Tx_1$ to $L-Tx_n$ (often generically called L-Tx) to the common electrodes $COM_1$ to $COM_n$. The touch sensor driver 32b sequentially supplies touch drive signals $R-Tx_1$ to $R-Tx_n$ (often generically called R-Tx) to the common electrodes $COM_1$ to $COM_n$, in synchronization with the touch sensor driver 32a based on a clock. The auxiliary driver 34 and the common electrodes $COM_1$ to $COM_n$ are connected to each other by auxiliary lines, and the auxiliary driver 34 sequentially supplies auxiliary touch drive signals $B-Tx_1$ to $B-Tx_n$ (often generically called B-Tx) to the common electrodes $COM_1$ to $COM_n$ via the auxiliary lines, in synchronization with the touch sensor drivers 32a and 32b based on a clock. The touch drive signals L-Tx, R-Tx, and B-Tx correspond to the drive signal shown in FIG. 2. Thus, the touch drive signals L-Tx, R-Tx, and B-Tx are simultaneously supplied to the common electrodes COM, and the level of the drive signal is a sum of the touch drive signals L-Tx, R-Tx, and B-Tx. The common electrodes COM are driven from three positions or three directions of left, right and lower sides and driven with a drive power which is a triple of the drive power in a case where the electrodes are driven by one driver.

The common electrodes COM for touch detection serve as electrodes for display and are composed of a plurality of stripe electrodes. The touch sensor drivers 32a and 32b are provided along both shorter sides of the stripe electrodes, and the auxiliary driver 34 is provided along one longer side of the stripe electrodes. Each of the stripe electrodes is driven by the touch sensor drivers 32a and 32b and the auxiliary driver 34.

As shown in FIG. 4, the auxiliary driver 34 has a length approximately equal to the common electrodes COM in the X direction, and the auxiliary touch drive signals $B-Tx_1$ to $B-Tx_n$ lines are provided along an approximately full length of the common electrodes COM. In other words, the first (most leftward) auxiliary touch drive signal $B-Tx_1$ is provided on approximately left edges of the common electrodes COM, and the n-th (most rightward) auxiliary touch drive signal $B-Tx_n$ is provided on approximately right edges of the common electrodes COM. The first auxiliary touch drive signal B-Tx$_1$ is connected to the approximately left edge of the common electrode COM$_1$ in the first row, and the n-th auxiliary touch drive signal B-Tx$_n$ is connected to the approximately right edge of the common electrode COM$_n$ in the n-th row.

FIG. 5 is a circuit diagram showing the pixel array in the display area DA. Each of the pixels includes a switching element 46 composed of a thin film transistor, a pixel electrode 48, and a common electrode 50. Each pixel includes the common electrode 50 in the circuit diagram but, in fact, independent common electrodes 50$_1$, 50$_2$, . . . (generically called 50) are not provided for the respective pixels. The common electrode COM$_1$ shown in FIG. 4 corresponds to the common electrodes 50$_1$, 50$_1$, . . . of the pixels in the first row in FIG. 5, and the common electrode COM$_2$ corresponds to the common electrodes 50$_2$, 50$_2$, . . . of the pixels in the second row. The common electrode COM and the common electrode 50 may be used separately for convenience but both indicate the same electrode.

Gate terminals of the switching elements 46 in the pixels in each row are connected commonly to a gate line G. Ends of gate lines G$_1$, G$_2$, . . . in each row are drawn to right and left frame areas of the display area DA and connected to gate drivers 44a and 44b provided in the frame area. The gate drivers 44a and 44b selectively turn on the pixels in every row during the display period. The gate drivers 44a and 44b do not need to be provided on the right and left side of the display area DA but the gate driver 44 may be provided on either side alone.

Drain terminals of the switching elements 46 in the pixels in each column are connected commonly to a signal line S. An end of signal lines S$_1$, S$_2$, . . . of the respective columns is drawn to the frame area on the display area DA and connected to a source amplifier 42 in the display driver 26 provided in the frame area. The source amplifier 42 supplies video signals for display to the pixels of each column of the pixel row which are selectively turned on during the display period. The video signal is composed of video signals of color components of three colors, i.e., red, green, and blue, and the video signal supplied from the host device 22 to the display driver 26 is a signal in which the video signals of the color components of three colors, i.e., red, green, and blue are multiplexed. For this reason, the display driver 26 includes a multiplexer which separates the multiplexed signals to the video signals of the color components of three colors, i.e., red, green, and blue, and any one of the video signals of the color components three colors, i.e., red, green, and blue is supplied to each pixel.

Source terminals of the switching elements 46 in the pixels are connected to the pixel electrodes 48. A liquid crystal layer is provided between the pixel electrode 48 and the common electrode 50. The touch sensor driver 32a supplies the touch drive signals L-Tx$_1$, L-Tx$_2$, . . . to the common electrodes 50 of the pixels in each row. The touch sensor driver 32b supplies the touch drive signals R-Tx$_1$, R-Tx$_2$, . . . to the common electrodes 50 of the pixels in each row. The auxiliary driver 34 supplies the auxiliary touch drive signals B-Tx$_1$, B-Tx$_2$, to the common electrodes 50 in one of the pixels in the respective rows. For example, the auxiliary driver 34 supplies the auxiliary touch drive signal B-Tx$_1$ to the common electrode 50$_1$ in the pixel in the first column, of the pixels in the first row, and supplies the auxiliary touch drive signal B-Tx$_2$ to the common electrode 50$_2$ in the pixel in the second column, of the pixels in the second row. Thus, the common electrodes 50 are driven by three equivalent drivers 32a, 32b, and 34. For this reason, the common electrodes 50 are driven with the drive power which is a triple of the power in a case where the electrodes 50 are driven by one driver.

The number of the auxiliary driver 34 is one, but two auxiliary drivers 34 may be prepared similarly to the touch sensor drivers 32 and provided in the upper and lower frame areas, respectively. In this case, the common electrodes 50 are driven from four positions or four directions of upper, lower, right, and left sides and driven with a drive power which is a quadruple of the drive power in a case where the electrodes 50 are driven by one driver.

Three or four drivers are provided in plural areas of the upper, lower, right, and left frame areas of the display area DA, but the drivers may be provided at one position, the lines may be drawn along the display area DA, the drive signal lines may be connected to the common electrodes 50 from plural areas of the upper, lower, right, and left frame areas of the display area DA, and the drive signals may be supplied to the common electrodes 50 from plural positions or directions.

The touch sensor drivers 32a and 32b and the auxiliary driver 34 have the same structure but, for convenience, the drivers provided on the right and left sides of the display area DA are called the touch sensor drivers 32a and 32b while the driver provided under the display area DA is called the auxiliary driver 34. FIG. 6 is an example of a circuit diagram showing the touch sensor drivers 32a and 32b and the auxiliary driver 34. Each of the touch sensor drivers 32a and 32b and the auxiliary driver 34 includes a scanning circuit 52 to which the start pulse and the clock are supplied. The scanning circuit 52 receives the start pulse and the clock and sequentially outputs a plurality of enable signals EN$_1$, EN$_2$, . . . (generically called EN) that are the same signals as the clock. The number of the enable signals EN is equal to the number of the common electrodes COM. The common electrodes COM are scanned by the scanning circuit 52.

As shown in FIG. 4, the display driver 26 includes two ports to output the start pulse, the clock, the selected voltage signal VCOMSEL, the DC voltage signal VCOMDC, and the drive pulse TxVCOM, and the output ports are connected to the touch sensor drivers 32a and 32b, respectively. The start pulse, the clock, the selected voltage signal VCOMSEL, the DC voltage signal VCOMDC, and the drive pulse TxVCOM supplied to the touch sensor driver 32a are also supplied from the touch sensor driver 32a to the auxiliary driver 34.

Each of the enable signals EN is supplied to the common electrodes COM via the circuit of the same configuration shown in FIG. 6 as the touch drive signals L-Tx, R-Tx, and B-Tx. The enable signal EN is input to a first input terminal of a first AND gate 54 and input to a first input terminal of a second AND gate 56 via an inverter 58. The selected voltage signal VCOMSEL is input to second input terminals of the first AND gate 54 and the second AND gate 56. The drive pulse TxVCOM is output via a switch 60 as the touch drive signals L-Tx, R-Tx, and B-Tx. Alternatively, the DC voltage VCOMDC is output via a switch 62 as the touch drive signals L-Tx, R-Tx, and B-Tx. An output of the first AND gate 54 turns on/off the switch 60 and an output of the second AND gate 56 turns on/off the switch 62. The switches 60 and 62 turn on when the outputs of the AND gates 54 and 56 are "1" level and turn off when the outputs are "0" level.

[Operation Waveform]

Figure 7:
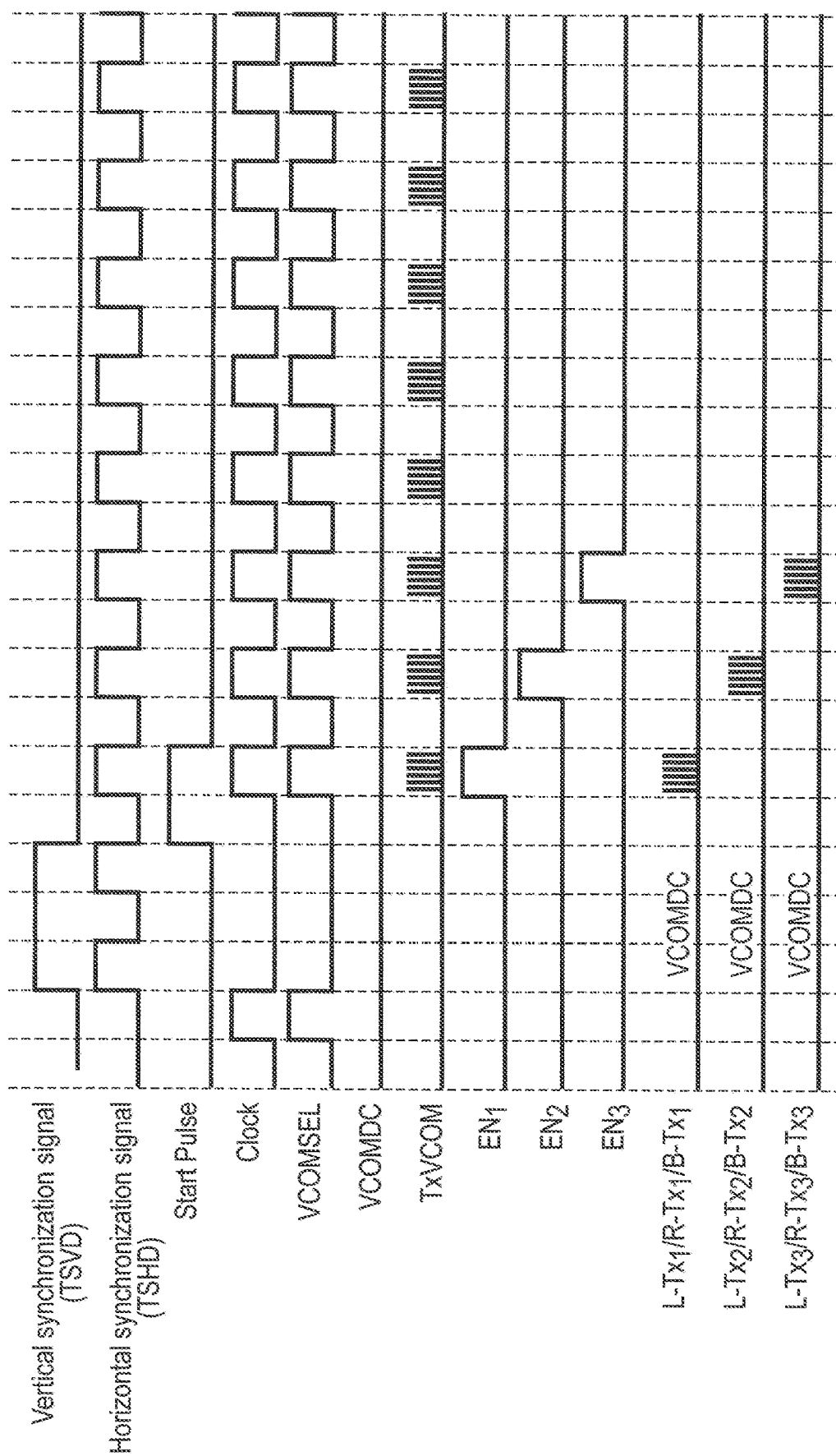
FIG. 7 is a timing chart showing an example of operations of the touch sensor drivers 32a and 32b and the auxiliary driver 34 shown in FIG. 6.

FIG. 7 is a timing chart showing examples of operations of the touch sensor drivers 32a and 32b and the auxiliary driver 34 shown in FIG. 6. The display driver 26 generates the horizontal synchronization signal TSHD in synchronization with the vertical synchronization signal TSVD. When the touch detector 24 receives the vertical synchronization signal TSVD and the horizontal synchronization signal TSHD from the display driver 26, the touch detector 24 generates the drive synchronization signal EXVCOM which is a high frequency pulse, from a reference frequency oscillator (not shown) inside the touch detector 24 and supplies the drive synchronization signal EXVCOM to the display driver 26. When the vertical synchronization signal TSVD falls, the display driver 26 supplies a start pulse having a one-cycle pulse width of the horizontal synchronization signal TSHD, a clock having the same waveform as the horizontal synchronization signal TSHD, and the selected voltage signal VCOMSEL to the touch sensor drivers 32a and 32b and the auxiliary driver 34. The clock and the selected voltage signal VCOMSEL are not output while the vertical synchronization signal TSVD is output. Furthermore, the display driver 26 supplies the DC voltage signal VCOMDC which is a constant VCOM potential, and the drive pulse TxVCOM having the same waveform as the drive synchronization signal EXVCOM supplied from the touch detector 24, to the touch sensor drivers 32a and 32b and the auxiliary driver 34.

When supplied with the start pulse, the touch sensor drivers 32a and 32b and the auxiliary driver 34 sequentially output enable signals $EN_1$, $EN_2$, $EN_3$, ... having the same waveform as the selected voltage signal VCOMSEL in synchronization with the clock. The enable signal EN is output during the touch detection period. In other words, the period in which the selected voltage signal VCOMSEL is "1" level is the touch detection period, and the period in which the selected voltage signal VCOMSEL is "0" level is the display period.

The first AND gate 54 allows the selected voltage signal VCOMSEL to pass and turns on the switch 60 in the touch detection period in which the enable signals $EN_1$, $EN_2$, $EN_3$, are output. For this reason, the drive pulse TxVCOM is output as the touch drive signals $L-Tx_1$, $R-Tx_1$, $B-Tx_1$; $L-Tx_2$, $R-Tx_2$, $B-Tx_2$; $L-Tx_3$, $R-Tx_3$, $B-Tx_3$ ... in the touch detection period. The high frequency pulse for touch detection is thereby supplied to the common electrodes COM in the touch detection period.

The second AND gate 56 allows the selected voltage signal VCOMSEL to pass and turns on the switch 62 in the display period in which the enable signals $EN_1$, $EN_2$, $EN_3$, ... are not output. For this reason, not the touch drive signals $L-Tx_1$, $R-Tx_1$, $B-Tx_1$; $L-Tx_2$, $R-Tx_2$, $B-Tx_2$; $L-Tx_3$, $R-Tx_3$, $B-Tx_3$ ... (the drive pulse TxVCOM), but the constant DC voltage signal VCOMDC is supplied to the common electrodes COM in the display period.

[Sectional Structure]

Figure 8:
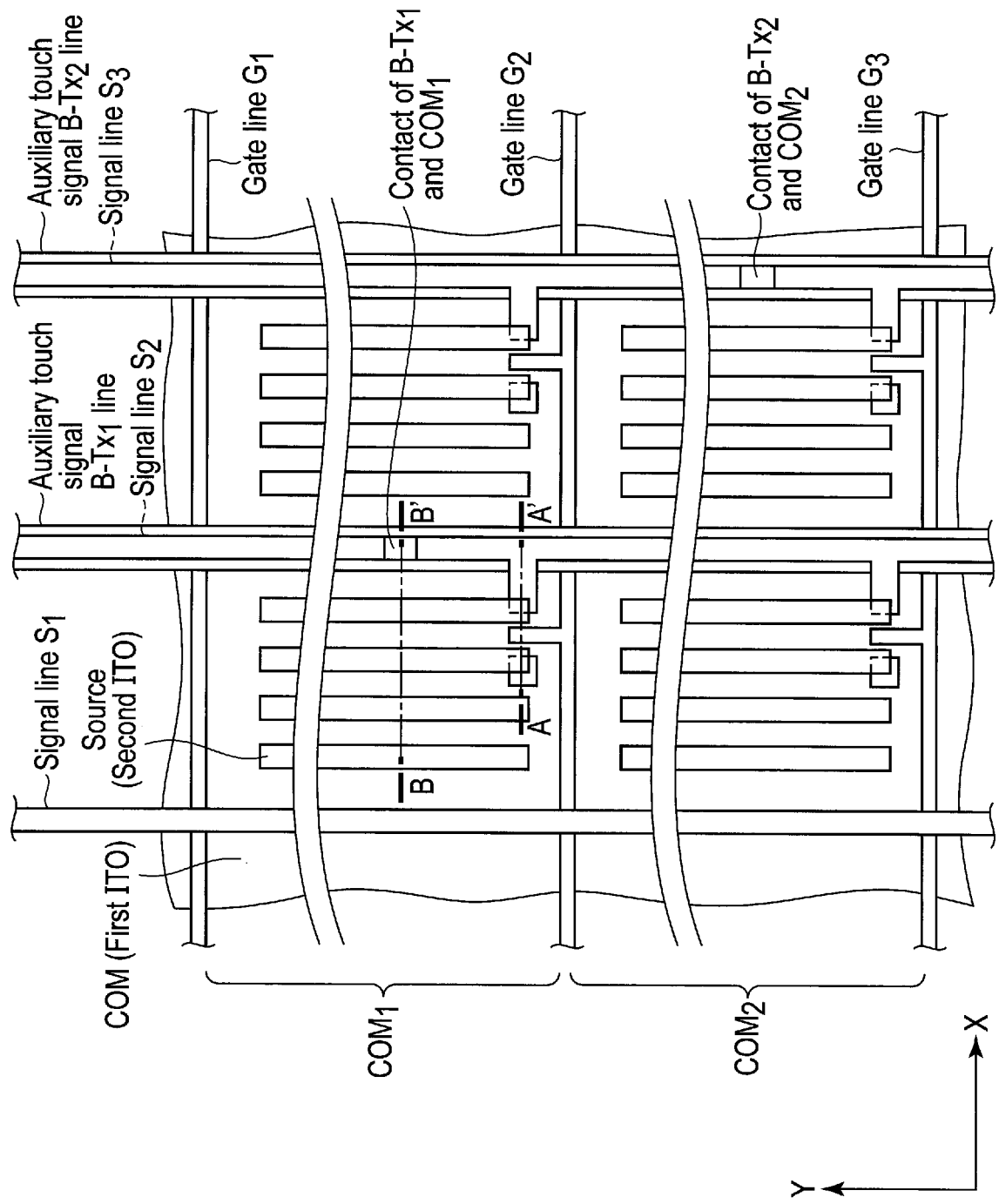
FIG. 8 is a plan view showing an example of a first substrate $SUB_1$.

FIG. 8 is a plan view of the first substrate $SUB_1$. FIG. 9A is a cross-sectional view seen along line A-A of FIG. 8, and FIG. 9B is a cross-sectional view seen along line B-B' of FIG. 8. As shown in FIG. 8, the signal lines S and the auxiliary touch drive signal B-Tx lines which is connected to the auxiliary driver 34 are formed to extend in the Y direction, and the gate lines G are formed to extend in the X direction. Pixels (TFT) are formed in areas surrounded by the signal lines S or the auxiliary touch drive signal B-Tx lines and the gate lines G. The auxiliary touch drive signal $B-Tx_n$ line of the pixel in the n-th column is formed to overlap the signal line S(n+1) of the pixel in the (n+1)-th column.

As shown in FIGS. 9A and 9B, a P—Si layer 103 and a SiNx/SiO2 layer 104 are formed on a glass substrate (TFT Glass) 102 of the first substrate $SUB_1$. The gate line Gn is formed on the P—Si layer 103 via the SiNx/SiO2 layer 104 to form a TFT 46. The signal line $S_2$ is made conductive with a drain terminal of the TFT 46 through a via hole 120.

A color filter and a black matrix are formed on the second substrate $SUB_2$ though not illustrated in FIGS. 9A and 9B. The black matrix is a light-shielding portion provided to partition the pixels. The signal lines S are formed in the areas which are shielded from the light by the black matrix. To reduce the resistance of the display panel, a metal line 108 called a third metal line is provided in the area which is shielded from the light by the black matrix. The auxiliary touch drive signal $B-Tx_1$ line is formed by the third metal line 108.

The third metal line (auxiliary touch drive signal B-Tx line) 108 is covered with an organic flattening film (HRC film) 106 formed on the SiNx/SiO2 layer 104. A first indium tin oxide (ITO) layer 110 forming the common electrodes COM is formed on the HRC film 106. Both ends of the first ITO layer 110 are connected to the touch sensor drivers 32a and 32b. A contact area 118 for the third metal line (auxiliary touch drive signal B-Tx line) 108 is formed on the first ITO layer 110. A second ITO layer 114 forming the pixel electrode 48 is formed on the first ITO layer 110 via a SiN layer 112. The second ITO layer 114 is made conductive with a source terminal of the TFT 46 through a via hole 122.

Summary of First Embodiment

As explained above, in the first embodiment, the common electrodes for touch detection are driven by at least three drivers. For this reason, the common electrodes can be driven with a desired waveform and the touch can be detected accurately even when a time constant of CR based on the parasitic capacitance and the parasitic resistance is large. At least three drivers are provided in the frame area other than the display area DA of the substrate. At least three drivers do not need to be provided, but modification to provide one or two drivers having a high drive power can be made. At least three types of signal lines may be provided to supply the drive signals from the driver or drivers to the common electrodes. The at least three types of signal lines may be extended to common electrodes from at least three positions or three directions in the surrounding of the common electrodes. According to the embodiment, the touch can be detected without extending the touch detection period even when the screen size is enlarged or particularly elongated (in the X direction). Since the touch detection time does not need to be extended, the display frame rate can be made higher.

Second Embodiment

[Circuit Configuration]

Figure 10:
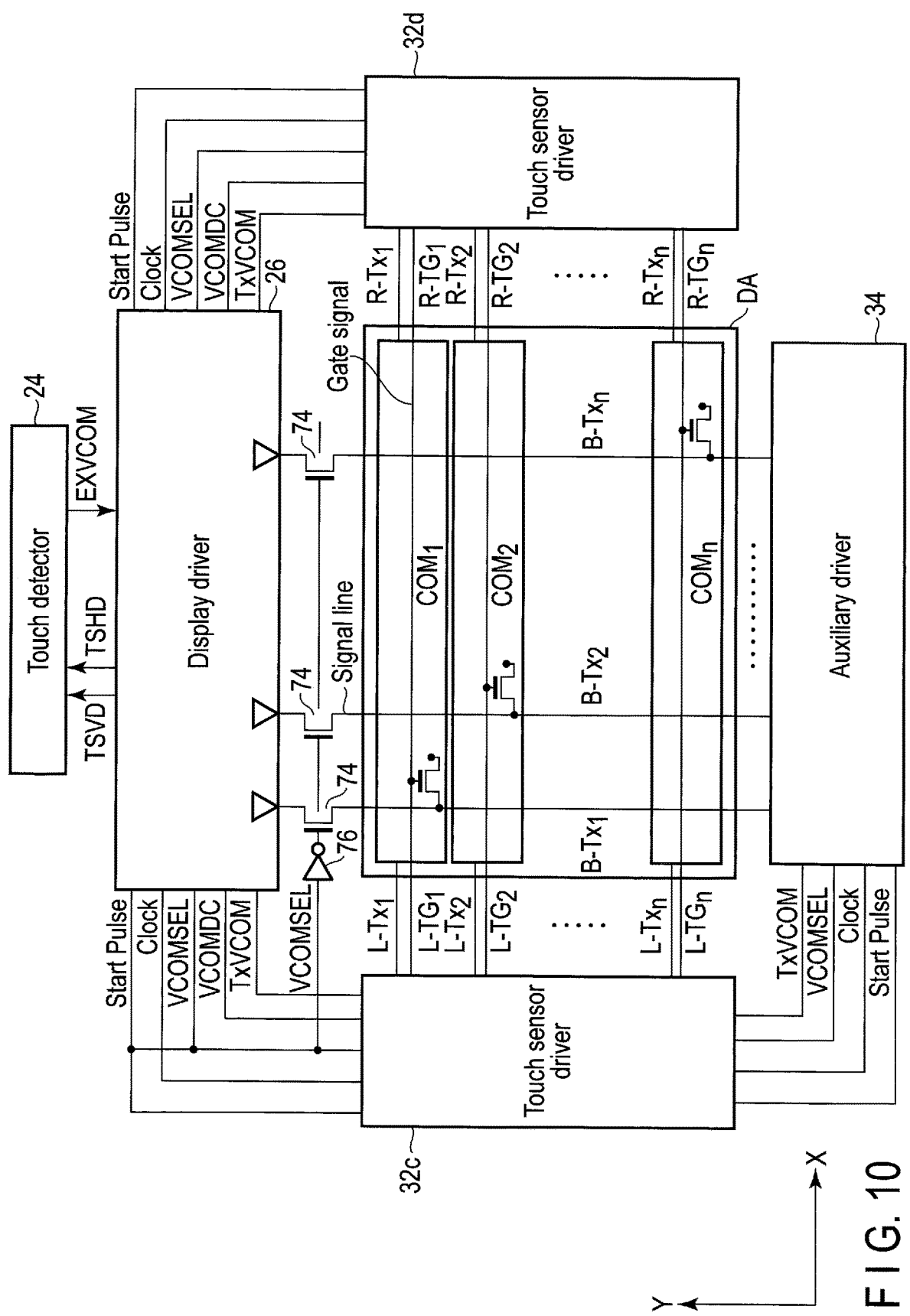
FIG. 10 is a diagram showing an example of a layout of the display driver 26 and the touch sensor driver 32 according to second embodiment.

FIG. 10 is a diagram showing an example of a layout of the display driver 26 and the touch sensor driver 32 according to the second embodiment. The second embodiment includes two touch sensor drivers 32c and 32d and the auxiliary driver 34. In the first embodiment, the auxiliary touch drive signal B-Tx line connected to the auxiliary driver 34 and extended in the Y direction and the signal line S connected to the source amplifier 42 and extended in the Y direction are provided separately. For this reason, the auxiliary touch drive signal B-Tx line is formed by the third metal line. Since the auxiliary touch drive signal B-Tx line is used in the touch detection period, the signal line S is used in the display period and both of the lines are not used simultaneously, one line serves as both of the lines in the second embodiment. Each of the common electrodes COM is connected to a line extending in the Y direction, an end of the line serves as an auxiliary touch drive signal B-Tx line connected to the auxiliary driver 34, and the other end of the line serves as the signal line S connected to the display driver 26 (source amplifier) via a switch element 74.

FIG. 11 is a circuit diagram showing a pixel array included in the display area DA shown in FIG. 10. Each of the pixels includes the switching element (herein referred as a first switching element) 46 formed of TFT, the pixel electrode 48, and a common electrode 70. The auxiliary driver 34 supplies the auxiliary touch drive signals B-Tx$_1$, B-Tx$_2$, . . . to the common electrode 70 in one of the pixels in the respective rows via a second switching element 72. For example, the auxiliary driver 34 supplies an auxiliary touch drive signal B-Tx$_1$ to a common electrode 70$_1$ in the pixel in the first column, of the pixels in the first row, and supplies the auxiliary touch drive signal B-Tx$_1$ to a common electrode 70$_2$ in the pixel in the first column, of the pixels in the second row. The first switching element 46 is a switching element for writing a video signal to the pixel in the display period, similarly to the first embodiment, and the second switching element 72 is a switching element for writing the auxiliary touch drive signal B-Tx to the pixel in the touch detection period. Similarly to the common electrodes 50, the common electrode COM$_1$ shown in FIG. 10 corresponds to common electrodes 70$_1$, 70$_1$, . . . in the pixels in the first row in FIG. 11, and the common electrode COM$_2$ corresponds to common electrodes 70$_2$, 70$_2$, . . . in the pixels in the second row.

Similarly to the first embodiment, gate terminals of the first switching elements 46 in the pixels in each row are connected commonly to a gate line G. Ends of gate lines G$_1$, G$_2$, . . . in each row are drawn to right and left frame areas of the display area DA and connected to gate drivers 44a and 44b provided in the frame area. The gate drivers 44a and 44b turn on the pixels in every row during the display period. Drain terminals of the first switching elements 46 in the pixels in each column are connected commonly to the signal line S/auxiliary touch drive signal B-Tx line. An end of the signal line S/auxiliary touch drive signal B-Tx line in each column is drawn to the frame area on the display area DA and connected to a source amplifier 42 in the display driver 26 provided in the frame area as the signal line S. The switching element 74 is turned on/off by a selected voltage signal VCOMSEL which is output from the display driver 26 and input via an inverter 76. Since the selected voltage signal VCOMSEL is "1" level in the touch detection period and "0" level in the display period, the switching element 74 is turned on in the display period and turned off in the touch detection period. For this reason, the output signal of the source amplifier 42 is written to each pixel via the signal line S, in the display period. The signal line S becomes a floating state in the touch detection period. The other end of the signal line S/auxiliary touch drive signal B-Tx line in each column is drawn to the frame area under the display area DA and connected to the auxiliary driver 34 provided in the frame area as the auxiliary touch drive signal B-Tx line.

Source terminals of the switching elements 46 in the pixels in each column are connected to the pixel electrodes 48. A liquid crystal layer is provided between the pixel electrodes 48 and the common electrodes 70. The touch sensor driver 32c supplies touch drive signals L-Tx$_1$, L-Tx$_2$, . . . to the common electrodes 70$_1$, 70$_2$, . . . in the pixels in each row. The touch sensor driver 32d supplies touch drive signals R-Tx$_1$, R-Tx$_2$, . . . to the common electrodes 70$_1$, 70$_2$, . . . in the pixels in each row. Drain terminals of the second switching elements 72 in the pixels in each column are connected commonly to the signal line S/auxiliary touch drive signal B-Tx line, and source terminals of the second switching elements 72 are connected to the common electrodes 70.

The touch sensor driver 32c supplies sensor line select gate signals L-TG$_1$, L-TG$_2$, . . . to gates of the second switching elements 72 in the pixels in each row. The touch sensor driver 32d supplies sensor line select gate signals R-TG$_1$, R-TG$_2$, . . . to the gates of the second switching elements 72 in the pixels in each row. The second switching element 72 is a switching element for supplying the auxiliary touch drive signal B-Tx to the common electrode 70 in the touch detection period.

It is assumed that one second switching element 72 is connected to one common electrode 70 in FIG. 10, but a plurality of auxiliary touch drive signals B-Tx may be supplied to one common electrode 70 via a plurality of second switching elements 72. In this case, the second switching elements 72 serve as parallel-connected resistors for the common electrode 70 and the resistance value is lowered.

Figure 12:
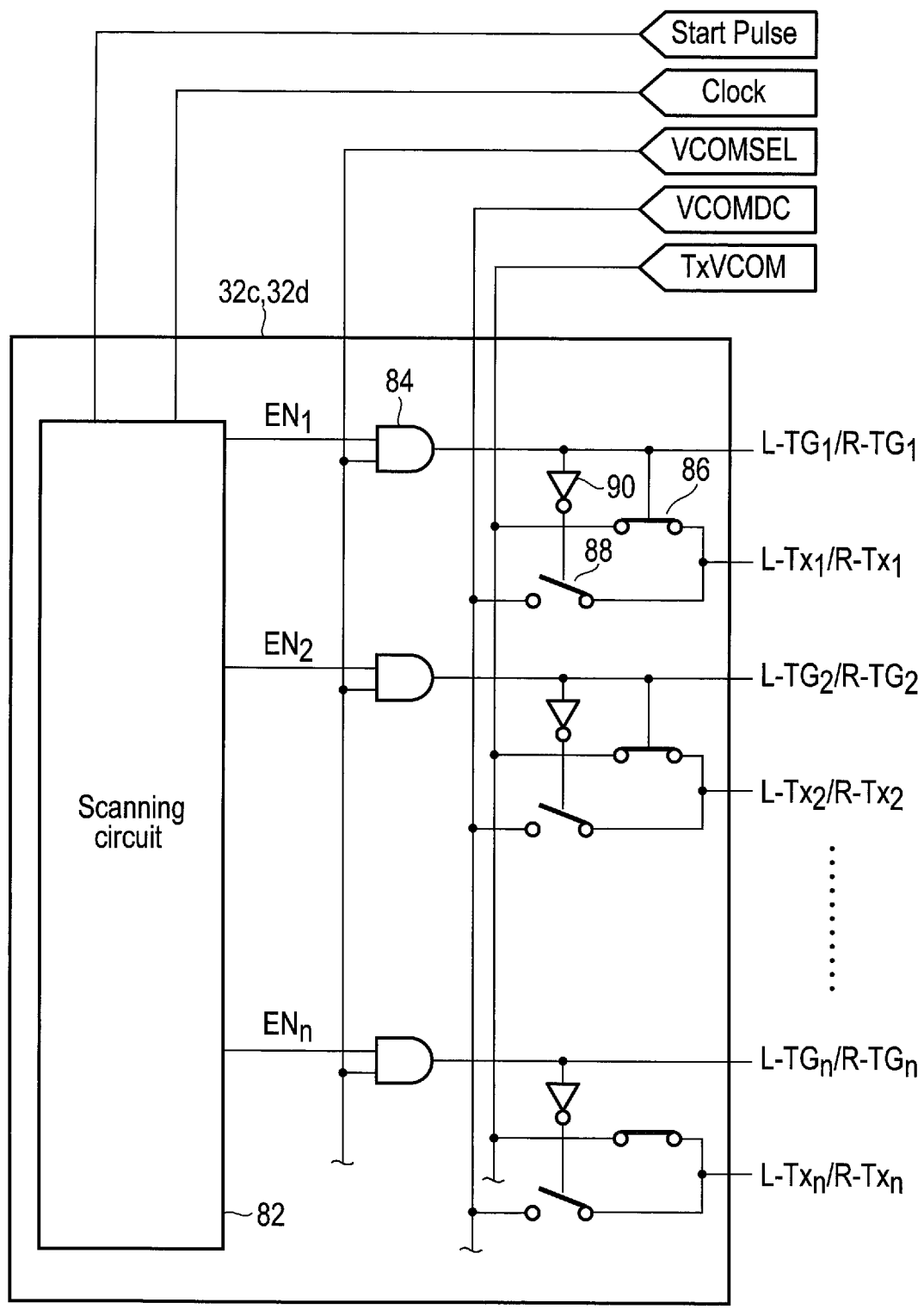
FIG. 12 is a circuit diagram showing an example of touch sensor drivers 32c and 32d.

FIG. 12 is an example of a circuit diagram showing the touch sensor drivers 32c and 32d. Each of the touch sensor drivers 32c and 32d includes a scanning circuit 82 to which the start pulse and he clock are supplied. The scanning circuit 82 receives the start pulse and the clock and sequentially outputs a plurality of enable signals EN$_1$, EN$_2$, . . . (generically called EN) that are the same signals as the clock. The number of the enable signals EN is equal to the number of the common electrodes COM. The common electrodes COM are scanned by the scanning circuit 82. Each of the enable signals EN is output from the auxiliary drivers 32c and 32d via circuits of the same configuration as the touch drive signal L-Tx or R-Tx and the sensor line select gate signal L-TG or R-TG. Each of the enable signals EN is input to a first input terminal of an AND gate 84. The selected voltage signal VCOMSEL is input to a second input terminal of the AND gate 84. An output of the AND gates 84 becomes the sensor line select gate signal L-TG or R-TG.

The drive pulse TxVCOM is output via a switch 86 as the touch drive signal L-Tx or R-Tx. Alternatively, the DC voltage VCOMDC is output via a switch 88 as the touch drive signal L-Tx or R-Tx. The output of the AND gate 84 turns on/off the switch 86 and the output of the AND gate 84 turns on/off the switch 88 via an inverter 90. The switches 86 and 88 turn on when the control signal supplied to the gate thereof is "1" level and turn off when the control signal is "0" level.

The auxiliary driver 34 of the second embodiment has the same configuration as the auxiliary driver 34 of the first embodiment.

Figure 13:
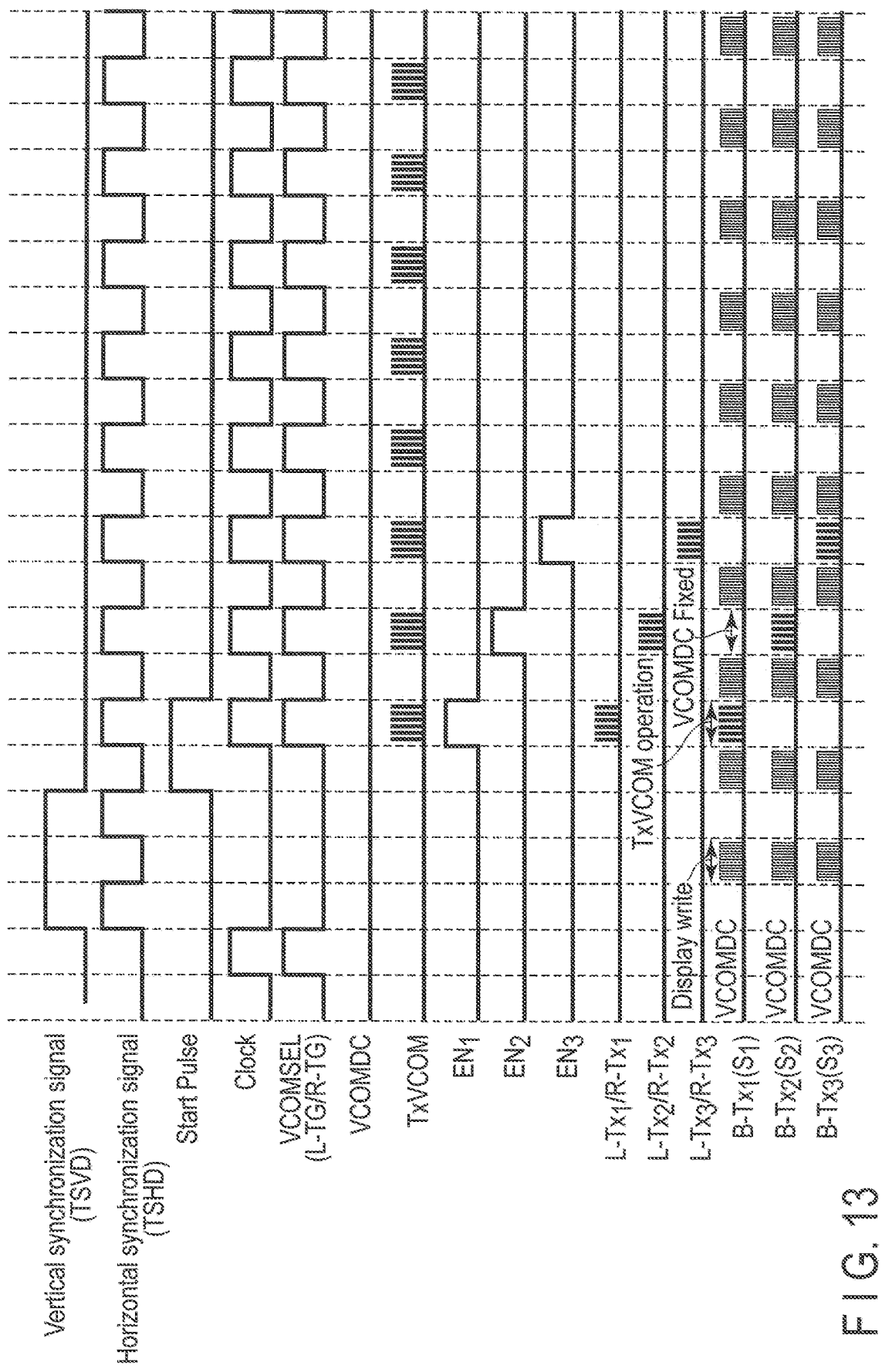
FIG. 13 is a timing chart showing examples of operations of the touch sensor drivers 32c and 32d and an auxiliary driver 34 according to the second embodiment.

FIG. 13 is a timing chart showing examples of operations of the touch sensor drivers 32c and 32d and the auxiliary driver 34 according to the second embodiment. The waveforms other than the auxiliary touch drive signal B-Tx lines also used as the signal lines S are the same as those of the first embodiment shown in FIG. 7.

The selected voltage signal VCOMSEL is "1" level the touch detection period, and "0" level in the display period. If the enable signal EN is "1" in the touch detection period, the selected voltage signal VCOMSEL passes through the AND gate 84, the selected voltage signal VCOMSEL is supplied to the gates of the second switching elements 72 in the pixels in each row as the sensor line select gate signals L-TG and R-TG, the switching elements 72 are turned on, and the common electrodes 70 in the pixels in each row are connected to the auxiliary touch drive signal B-Tx line. Since the auxiliary driver 34 outputs the drive pulse TxV-COM as the touch drive signal B-Tx in the touch detection period, a high frequency pulse for touch detection is supplied to the common electrode 70. In addition, if the enable signal EN is "1" in the touch detection period, the switch 86 is turned on, the touch sensor driver 32c and 32d output the drive pulses TxVCOM as the touch drive signals L-Tx and R-Tx, and a high frequency pulse for touch detection is therefore supplied to the common electrodes 70.

Since the output of the AND gate 84 is "0" level in the display period, the switch 88 is turned on, and not the touch drive signals L-Tx and R-Tx which are the drive pulses TxVCOM, but the constant DC voltage signal VCOMDC is supplied to the common electrodes 70. Since the switching element 74 is turned on in the display period, the video signal for display write as output from the source amplifier 42 is supplied to the pixel electrodes 48 in each row via the signal lines S, and the image is displayed.

[Sectional Structure]

Figure 14:
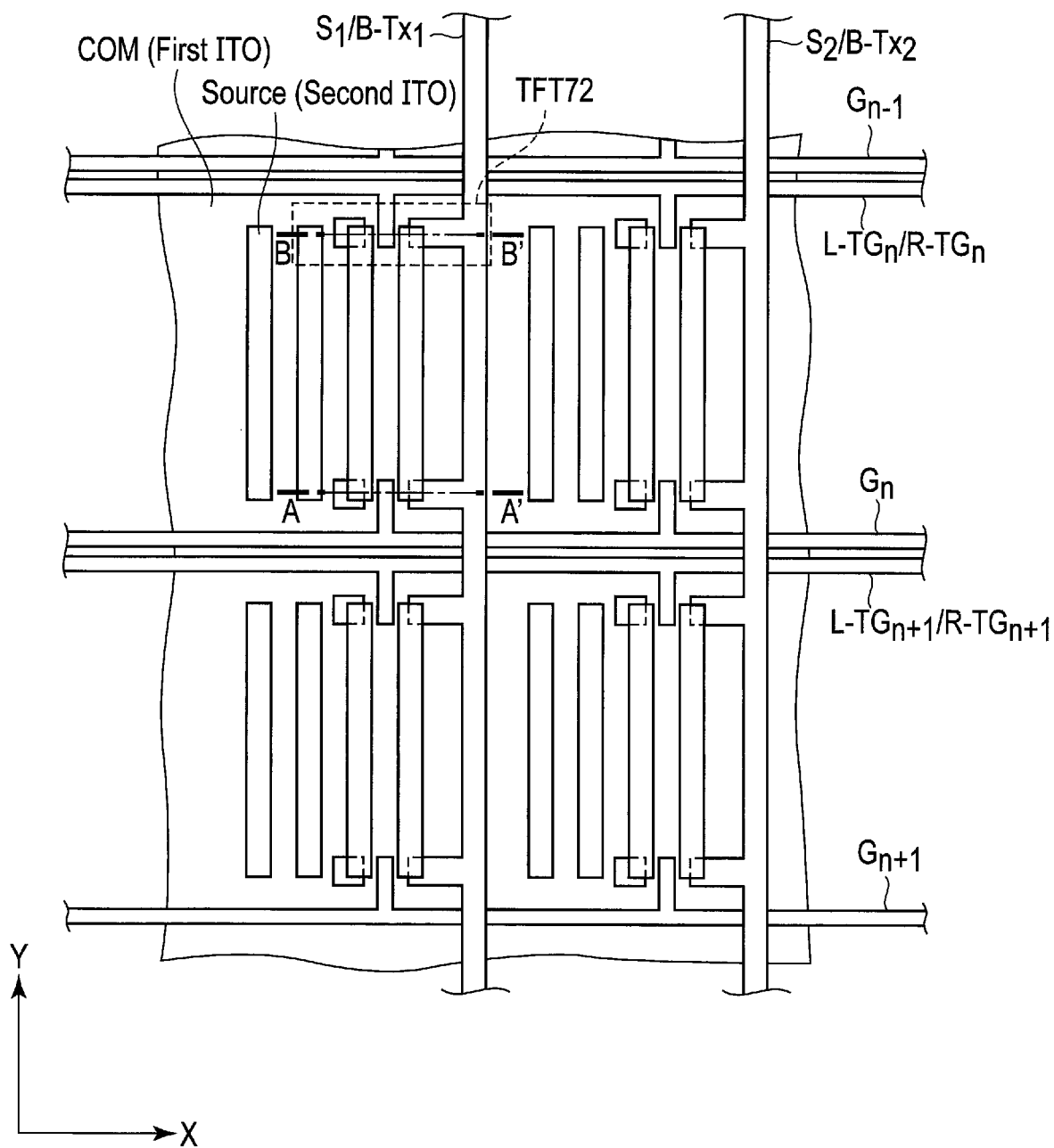
FIG. 14 is a plan view showing an example of a first substrate $SUB_1$.

FIG. 14 is a plan view of the first substrate SUB$_1$. FIG. 15A is a cross-sectional view seen along line A-A' of FIG. 14, and FIG. 15B is a cross-sectional view seen along line B-B' of FIG. 14. As shown in FIG. 14, the signal lines S/auxiliary touch drive signal B-Tx lines are formed to extend in the Y direction, and the gate lines G and the sensor line select gate signals L-TG/R-TG are formed to extend in the X direction. The pixels (TFT) are formed in areas surrounded by the signal lines S/auxiliary touch drive signal B-Tx lines and the gate lines G (or the sensor line select gate signal L-TG/R-TG lines). The gate line Gn in the pixel in the n-th row is formed near the sensor line select gate signal L-TG$_{n+1}$/R-TG$_{n+1}$ in the pixel in the (n+1)-th row.

As shown in FIGS. 15A and 15B, the P—Si layer 103 and the SiNx/SiO2 layer 104 are formed on the glass substrate (TFT Glass) 102 of the first substrate SUB$_1$. The gate line Gn is formed on the P—Si layer 103 via the SiNx/SiO2 layer 104 to form the TFT 46. The signal line S$_1$ is made conductive with a drain terminal of the TFT 46 through the via hole 120.

The auxiliary touch drive signal B-Tx line is formed by the third metal line 108 in the first embodiment but, in the second embodiment, the third metal line 108 is not used in the third embodiment since the auxiliary touch drive signal B-Tx line is also used as the signal line S.

The first ITO layer 110 constituting the common electrodes COM is formed on the HRC film 106. Both ends of the first ITO layer 110 are connected to the touch sensor drivers 32c and 32d. The first ITO layer 110 is connected to a drain terminal of the TFT 72 through the via hole 128. The second ITO layer 114 to form the pixel electrode 48 is formed on the first ITO layer 110 via the SiN layer 112. The second ITO layer 114 is made conductive with a source terminal of the TFT 46 through the via hole 122.

Summary of Second Embodiment

As explained above, the auxiliary touch drive signal B-Tx line extending in the Y direction and the signal line S extending in the Y direction in the first embodiment are formed of the same single line in the second embodiment. Not only the advantages of the first embodiment can be obtained but the number of signal lines can be reduced. When the number of signal lines is reduced, margin of the line space is increased and the parasitic resistance and parasitic capacitance can be reduced.

Modified Examples

Figure 16:
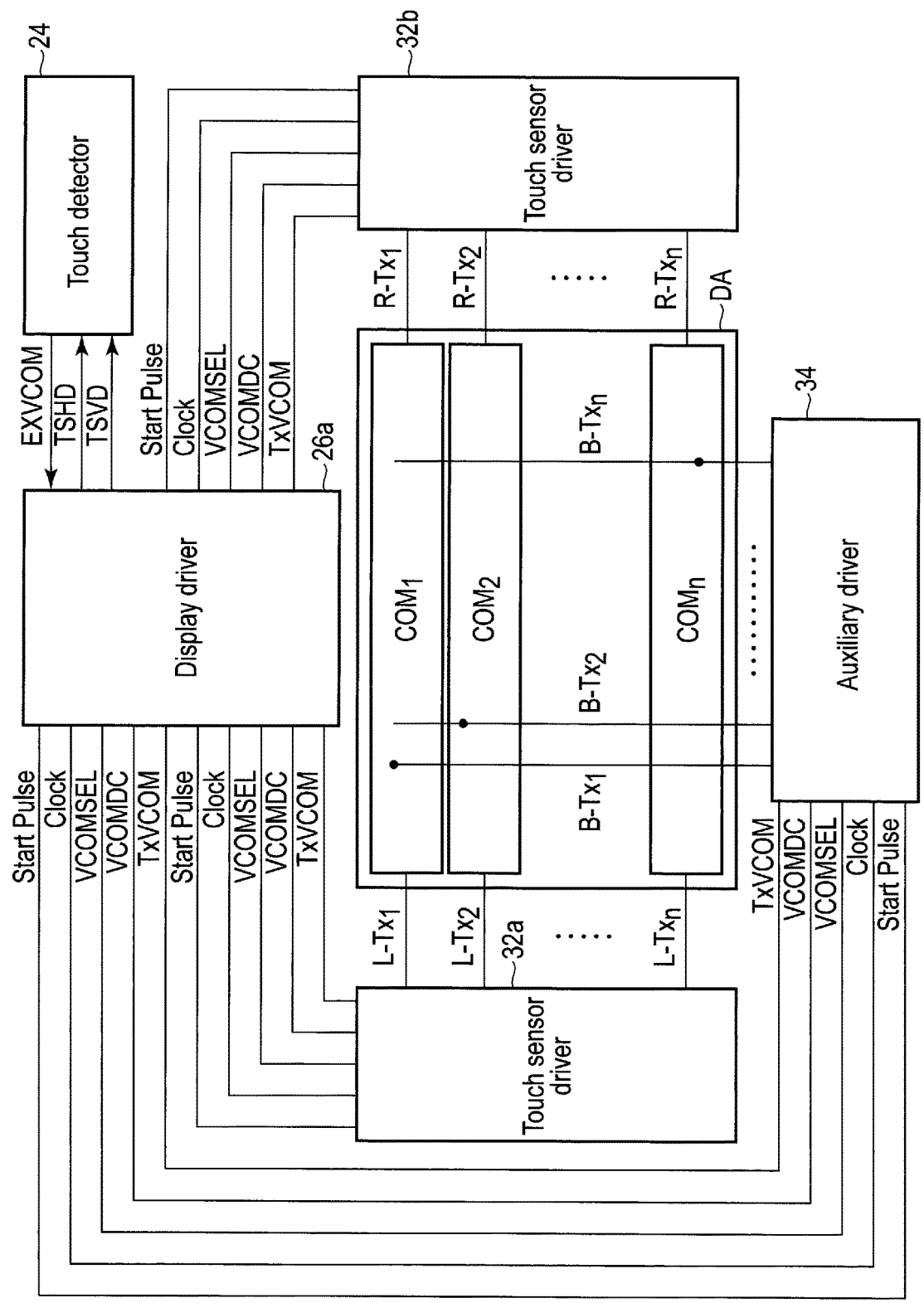
FIG. 16 is a circuit diagram showing an example of a block circuit according to a first modified example.

In the above-explained embodiments, the display driver 26 includes two output ports for supplying the start pulse, clock, selected voltage signal VCOMSEL, DC voltage signal VCOMDC, and drive pulse TxVCOM to the touch sensor drivers 32a and 32b. The start pulse, clock, selected voltage signal VCOMSEL, DC voltage signal VCOMDC, and drive pulse TxVCOM are supplied from the touch sensor driver 32 to the auxiliary driver 34. In the modification of FIG. 16, the display driver 26a includes three output ports for supplying the start pulse, clock, selected voltage signal VCOMSEL, DC voltage signal VCOMDC, and drive pulse TxVCOM to the touch sensor drivers 32a and 32b and the auxiliary driver 34. By driving each of the drivers 32a, 32b, and 34 by the single display driver 26a, the drive power can be increased and the drivers 32a, 32b, and 34 can be certainly synchronized.

Next, modified examples of providing a plurality of auxiliary drivers 34 are shown in FIGS. 17A, 17B, and 17C. As shown in FIG. 17A, two auxiliary drivers 34b and 34a may be provided in the frame areas on the upper and lower sides of the display area DA and the common electrodes COM may be driven from the right, left, upper, and lower sides of the display area DA. In the above-explained embodiments, the auxiliary driver 34 provided in the frame area on the lower side of the display area DA has approximately the same length as the common electrodes COM in the X direction as shown in FIGS. 4 and 10, but the two auxiliary drivers 34b and 34a provided in the upper and lower frame areas may be shorter than the common electrodes COM in the X direction. The mounting space of the frame areas can be used effectively.

In FIG. 17A, a pair of auxiliary drivers 34b and 34a are provided on the upper and lower sides of the display area DA, but the number of pairs may be plural. For example, as shown in FIG. 17B, a plurality of, for example, three auxiliary drivers 34b$_1$, 34b$_2$, and 34b$_3$ may be provided in the frame area on the upper side of the display area DA, and a plurality of, for example, three auxiliary drivers 34a$_1$, 34a$_2$, and 34a$_3$ may be provided in the frame area on the lower side of the display area DA. According to the modified example shown in FIG. 17B, the auxiliary touch drive signals B-Tx are supplied to three points of each of the common electrodes COM, and the drive power is increased. In FIG. 17B, the number of auxiliary drivers 34 may be two, four, or more.

On an in-cell type display panel, margin of space to mount the auxiliary drivers 34 may not be present in the frame area since the number of circuits and the number of lines are large. In this case, as shown in FIG. 17C, the auxiliary touch drive signal B-Tx may be supplied to only the part of the common electrodes COM having large parasitic capacitance and parasitic resistance and a large time constant. For example, the parasitic capacitance and the parasitic resistance are considered large in the common electrode COM (lower side in the figure) remote from the display driver 26 provided in the frame areas on the upper side of the display area DA since the line length from the display driver 26 is long. For this reason, in FIG. 17C, a plurality of, for example, three auxiliary drivers 34a$_1$, 34a$_2$, and 34a$_3$ are provided in the frame area on the lower side of the display area DA, and the auxiliary touch drive signals B-Tx are supplied to three points of the lower common electrodes, for example, the (n−1)-th and n-th common electrodes $COM_{n−1}$ and $COM_n$. In FIG. 17C, the number of auxiliary drivers 34 may be one, two, four, or more.

FIGS. 18A, 18B, and 18C show modified examples in a case of applying examples of FIG. 17 to a longitudinal COM-type display panel in which the signal lines S and the common electrodes COM are parallel to each other. In the longitudinal COM-type display panel, the common electrodes COM are formed in a stripe shape extending in the Y direction and arranged in the X direction, and the touch sensor drivers 32a and 32b are provided in the frame areas on the upper and lower sides of the display area DA. In the modified example shown in FIG. 18A, two auxiliary drivers 34a and 34b may be provided in right and left frame areas of the display area DA, respectively, and the common electrodes COM may be driven from the right, left, upper, and lower sides. Two auxiliary drivers 34a and 34b provided in the right and left frame areas may be shorter than the common electrodes COM in the Y direction. The mounting space of the frame areas can be used effectively.

In FIG. 18A, a pair of auxiliary drivers 34a and 34b are provided on the right and left sides of the display area DA, but the number of pairs may be plural. For example, as shown in FIG. 18B, a plurality of, for example, three auxiliary drivers $34a_1$, $34a_2$, and $34a_3$ may be provided in the left frame area of the display area DA, and a plurality of, for example, three auxiliary drivers $34b_1$, $34b_2$, and $34b_3$ may be provided in the right frame area. According to the modified example shown in FIG. 18B, the auxiliary touch drive signals B-Tx are supplied to three points of each of the common electrodes COM, and the drive power is increased. In FIG. 18B, the number of auxiliary drivers 34 may be two, four, or more.

As shown in FIG. 18C, a plurality of, for example, three auxiliary drivers $34a_1$, $34a_2$, and $34a_3$ may be provided in the left frame area of the display area DA, and a plurality of, for example, three auxiliary drivers $34b_1$, $34b_2$, and $34b_3$ may be provided in the right frame area. Each of the auxiliary drivers may not supply the auxiliary touch drive signals B-Tx to all of the common electrodes COM, but supply the auxiliary touch drive signals B-Tx to only the part of the common electrodes at portions having a large time constant similarly to FIG. 17C, for example, central portions. In FIG. 18C, the number of auxiliary drivers 34 may be one, two, four, or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display unit configured to display an image;
an electrode unit provided in a display area of the display unit and configured to detect a touch by an external object; and
a driver circuit provided outside the display area and configured to drive the electrode unit, wherein
the electrode unit comprises a common electrode serving as an electrode for display,
the common electrode comprises stripe electrodes,
the driver circuit comprises a first driver, a second driver, a third driver, and auxiliary lines connecting the stripe electrodes to the third driver,
the first driver is provided along first shorter sides of the stripe electrodes and configured to output a first drive signal,
the second driver is provided along second shorter sides of the stripe electrodes and configured to output a second drive signal,
the third driver is provided along a first longer side of one of the stripe electrodes and configured to output a third drive signal, and
the stripe electrodes are driven by the first drive signal, the second drive signal, and the third drive signal in the touch detection period.

2. The display device of claim 1, further comprising:
signal lines configured to supply a video signal to the display unit, wherein
the signal lines are parallel to each other, and
the auxiliary lines are provided above the signal lines and overlap the signal lines.

3. The display device of claim 1, further comprising:
signal lines configured to supply a video signal to the display unit, wherein
common lines form the signal lines and the auxiliary lines, and
the common lines are connected to a video signal source via switching elements.

4. The display device of claim 1, further comprising:
a fourth driver provided along a second longer side of one of the stripe electrodes and configured to drive the stripe electrodes in the touch detection period.

5. The display device of claim 1, wherein
the third driver is configured to supply the third drive signal to a part of the stripe electrodes at a long distance from a video signal source or a touch detection unit.

6. The display device of claim 1, wherein
the first shorter sides and the second shorter sides of the stripe electrodes are parallel to a signal line configured to supply a video signal to the display unit.

7. The display device of claim 1, wherein
the first longer side of the one of the stripe electrodes is parallel to a signal line supplying a video signal to the display unit.

8. The display device of claim 1, wherein
the stripe electrodes are connected to a first line and a second line,
the first line is provided along a direction of the first longer side of the one of the stripe electrodes,
both ends of the first line outside the display area are connected to the driver circuit,
the second line is provided along a direction of the first shorter sides of the stripe electrodes, and
an end of the second line outside the display area is connected to the driver circuit.

9. The display device of claim 1, wherein
the first drive signal, the second drive signal, and the third drive signal are simultaneously supplied to the stripe electrodes.

10. The display device of claim 1, further comprising:
a display controller configured to output drive pulses in the touch detection period, and wherein
the first driver comprises a first switch for receiving the drive pulses;
the second driver comprises a second switch for receiving the drive pulses;

the third driver comprises a third switch receiving the drive pulses;

the first switch is conductive in the touch detection period thereby outputting the drive pulses as the first drive signal;

the second switch is conductive in the touch detection period thereby outputting the drive pulses as the second drive signal; and the third switch is conductive in the touch detection period thereby outputting the drive pulses as the third drive signal.

11. The display device of claim 1, further comprising:
a display driver configured to supply a constant voltage to the stripe electrodes in a display period.

12. A method for a display device, wherein the display device comprises:
 a display unit configured to display an image;
 an electrode unit provided in a display area of the display unit and configured to detect a touch by an external object; and
 a driver circuit provided outside the display area and configured to drive the electrode unit, wherein
 the electrode unit comprises a common electrode serving as an electrode for display,
 the common electrode comprises stripe electrodes,
 the driver circuit comprises a first driver, a second driver, a third driver, and auxiliary lines connecting the stripe electrodes to the third driver,
 the first driver is provided along first shorter sides of the stripe electrodes and configured to output a first drive signal,
 the second driver is provided along second shorter sides of the stripe electrodes and configured to output a second drive signal, and
 the third driver is provided along a first longer side of one of the stripe electrodes and configured to output a third drive signal, the method comprising:
 driving the stripe electrodes by the first drive signal, the second drive signal, and the third drive signal in the touch detection period.

13. The method of claim 12, further comprising:
supplying a constant voltage to the stripe electrodes in a display period.

14. The method of claim 12, wherein
the display device comprises a display controller configured to output drive pulses in the touch detection period;
the first driver comprises a first switch for receiving the drive pulses;
the second driver comprises a second switch for receiving the drive pulses;
the third driver comprises a third switch receiving the drive pulses; and
driving the stripe electrodes comprises:
 making the first switch conductive in the touch detection period thereby outputting the drive pulses as the first drive signal;
 making the second switch conductive in the touch detection period thereby outputting the drive pulses as the second drive signal; and
 making the third switch conductive in the touch detection period thereby outputting the drive pulses as the third drive signal.

* * * * *